(12) United States Patent
Belostotski et al.

(10) Patent No.: US 9,929,757 B2
(45) Date of Patent: Mar. 27, 2018

(54) METHOD AND SYSTEM FOR EXTRACTION OF NOISE PARAMETERS OF NONLINEAR DEVICES

(71) Applicant: UTI Limited Partnership, Calgary (CA)

(72) Inventors: Leo Belostotski, Calgary (CA); Michael Himmelfarb, Calgary (CA)

(73) Assignee: UTI Limited Partnership, Calgary, Alberta (CA)

( * ) Notice: Subject to any disclaimer, the term of this patent is extended or adjusted under 35 U.S.C. 154(b) by 0 days.

(21) Appl. No.: 15/493,811

(22) Filed: Apr. 21, 2017

(65) Prior Publication Data

US 2017/0310348 A1 Oct. 26, 2017

Related U.S. Application Data

(60) Provisional application No. 62/326,458, filed on Apr. 22, 2016, provisional application No. 62/376,281, filed on Aug. 17, 2016.

(51) Int. Cl.

| H04B 1/10 | (2006.01) |
|---|---|
| H04B 17/00 | (2015.01) |
| H04B 1/68 | (2006.01) |
| H04B 1/00 | (2006.01) |
| H04B 17/345 | (2015.01) |

(52) U.S. Cl.
CPC ............. H04B 1/10 (2013.01); H04B 17/345 (2015.01)

(58) Field of Classification Search
CPC .......... H04B 1/10; H04B 17/345; H04B 1/68; H04B 17/00; H04B 1/28; H04B 17/21; H04B 17/0085; H04B 1/00; H03D 7/005
See application file for complete search history.

(56) References Cited

U.S. PATENT DOCUMENTS

| 6,330,290 | B1 * | 12/2001 | Glas ....................... H03D 3/009 329/306 |
| 7,003,262 | B2 | 2/2006 | Fukui et al. |
| 7,020,220 | B2 * | 3/2006 | Hansen ............... H04L 27/0014 375/324 |
| 7,181,205 | B1 * | 2/2007 | Scott ..................... H04W 24/00 455/423 |

(Continued)

OTHER PUBLICATIONS

Agilent Technologies, "Agilent ENA RF Network Analyzers, Accurate Mixer Measurements Using the Frequency-Offset Mode," Application Note 1463-6, May 7, 2007, 24 pages.

(Continued)

*Primary Examiner* — Pablo Tran
(74) *Attorney, Agent, or Firm* — Lathrop Gage LLP

(57) ABSTRACT

Noise parameters are used to characterize noise performance of linear devices, such as amplifiers. Such noise parameters have not been used for frequency conversion devices, such as mixers. Direct measurements of single-side-band noise figures are accurately represented by the measured noise parameters, which fully characterize the noise figure of the mixers for all harmonic impedance loading conditions. Each harmonic side band of frequencies contributing noise to the mixer output is associated with a set of noise parameters. A measurement method for extracting the noise parameters is described.

20 Claims, 13 Drawing Sheets

(56) References Cited

U.S. PATENT DOCUMENTS

| | | | | |
|---|---|---|---|---|
| 7,917,091 | B2* | 3/2011 | Montemayor | H04B 1/28 375/345 |
| 2003/0206603 | A1* | 11/2003 | Husted | H04L 27/3863 375/324 |
| 2005/0047536 | A1* | 3/2005 | Wu | H04L 27/3863 375/346 |
| 2005/0148304 | A1* | 7/2005 | Jerng | H04B 1/30 455/75 |

OTHER PUBLICATIONS

Agilent Technologies, "Agilent N8973A, N8974A, N8975A NFA Series Noise Figure Analyzers," Data Sheet, Nov. 5, 2007, 12 pages.
Belostotski et al., "Evaluation of Tuner-Based Noise-Parameter Extraction Methods for Very Low Noise Amplifiers," IEEE Transactions on Microwave Theory and Techniques 58(1):236-250, 2010.
Belostotski, "A Calibration Method for RF and Microwave Noise Sources," IEEE Transactions on Microwave Theory and Techniques 59(1):178-187, 2011.
Belostotski, "On the Number of Noise Parameters for Analyses of Circuits With MOSFETs," 59(4):877-881, Apr. 2011.
Boglione, "An Original Demonstration of the $T_{min}/T_o \leq 4N$ inequality for Noisy Two-Port Networks," IEEE Microwave and Wireless Components Letters 18(5):326-328, May 2008.
Cappy et al., "Noise analysis in devices under nonlinear operation," Solid-State Electronics 43(1):21-26, 1999.
D'Addario, "Noise parameters of SIS mixers," IEEE Transactions on Microwave Theory and Techniques 36(7):1196-1206, 1988.
Darabi et al., "Noise in RF-CMOS mixers: A simple physical model," IEEE Journal of Solid State Circuits 35(1):15-25, Jan. 2000.
Davidson et al., "Accuracy improvements in microwave noise parameter measurements," IEEE Transactions on Microwave Theory and Techniques 37(12):1973-1978, Dec. 1989.
Dunsmore, "Novel method for vector mixer characterization and mixer test system vector error correction," i IEEE MTT-S International Microwave Symposium Digest 3:1833-1836, Jun. 2002.
Held et al., "Conversion Loss and Noise of Microwave and Millimeter-Wave Mixers: Part 1—Theory," IEEE Transactions on Microwave Theory and Techniques 26(2):pp. 49-55, Feb. 1978.
Heydari, "High-frequency noise in RF active CMOS mixers," in Asia and South Pacific Design Automation Conference, (Yokohama, Japan), pp. 57-61, 2730 Jan. 2004.
Hillbrand et al., "An efficient method for computer aided noise analysis of linear amplifier networks," IEEE Transactions on Circuits and Systems 23(4):235-238, Apr. 1976.
Himmelfarb et al., "On impedance-pattern selection for noise parameter measurement," IEEE Transactions on Microwave Theory and Techniques 64(1):258-270, Jan. 2016
Keysight Technologies, "Improving Measurement and Calibration Accuracy using the Frequency Converter Application in the PNA Microwave Network Analyzer," Application Note 5988-9642EN, Jul. 31, 2014, 25 pages.
Keysight Technologies, "Keysight 2-Port and 4-Port PNA-X Network Analyzer," Data Sheet and Technical Specifications N5242-90007, Feb. 22, 2017, 65 pages.
Lane, "The determination of device noise parameters," Proceedings of the IEEE 57(8):1461-1462, 1969.
Levenberg, "A Method for the Solution of Certain Problems in Least-Squares," Quarterly Applied Mathematics 2(2):164-168, 1944.
Maury Microwave Corporation, "Tuner Repeatability: Fact and Fiction," Jun. 9, 1999, 4 pages.
Mitama et al., "An Improved Computational Method for Noise Parameter Measurement," IEEE Transactions on Microwave Theory and Techniques 27(6):612-615, Jun. 1979.
Pasquet et al., "New Method for Noise-Parameter Measurement of a Mismatched Linear Two-Port Using Noise Power Wave Formalism," IEEE Transactions on Microwave Theory and Techniques 56:2136-2142, Sep. 2008.
Pospieszalski, "Modeling of noise parameters of MESFET's and MODFET's and their frequency and temperature dependence," IEEE Transactions on Microwave Theory and Techniques 37(9):1340-1350, Sep. 1989.
Randa et al., "On-Wafer Measurement of Transistor Noise Parameters at NIST," IEEE Transactions on Instrumentation and Measurement 56(2):551-554, Apr. 2007.
Randa, "Noise-Parameter Uncertainties: A Monte Carlo Simulation," Journal of Research of the National Institute of Standards and Technology, 107(5):431-444, 2002.
Randa, "Uncertainties in NIST Noise-Temperature Measurements," NIST Technical Note 1502, National Institute of Standards and Technology, Mar. 1998, 50 pages.
Rizzoli et al., "Computer-aided noise analysis of MESFET and HEMT mixers," IEEE Transactions on Microwave Theory and Techniques 37(9):1401-1410, 1989.
Rohde et al., "Parameter extraction for large signal noise models and simulation of noise in large signal circuits like mixers and oscillators," European Microwave Conference, pp. 465-470, 1993.
Sannino, "On the determination of device noise and gain parameters," Proceedings of the IEEE 67(9):1364-1366, Sep. 1979.
Terrovitis et al., "Noise in current-commutating CMOS mixers," IEEE Journal of Solid-State Circuits 34(6):772-783, Jun. 1999.
Vasilescu et al., "Exact computation of two-port noise parameters," Electronics Letters 25(4):292-293, Feb. 16, 1989.

* cited by examiner (a) RF input referred noise factor.

(b) IM input referred noise factor.

(a) RF input referred noise factor.

(b) IM input referred noise factor.

(a) RF input referred error in modeling noise factor.

(b) IM input referred error in modeling noise factor.

(a) TLC55933 RF input referred error in noise factor.

(b) TLC55933 IM input referred error in noise factor.

METHOD AND SYSTEM FOR EXTRACTION OF NOISE PARAMETERS OF NONLINEAR DEVICES

CROSS-REFERENCE TO RELATED APPLICATION

This application claims the benefit of U.S. provisional application 62/326,458, filed Apr. 22, 2016 and U.S. provisional application 62/376,281, filed Aug. 17, 2016. Each of which is incorporated by reference herein in its entirety.

BACKGROUND OF THE INVENTION

A mixer or frequency mixer or frequency conversion device is an electrical circuit that creates new frequencies from frequencies of signals applied to it. In its most common application, two signals at frequencies are applied to a mixer, and it produces new signals as the sum or difference of the original frequencies. Other frequency components may also be produced in a practical frequency mixer. Mixers are widely used to shift signals from one frequency range to another, but also as a product detector, modulator, phase detector or frequency multiplier. Mixers can be coupled with a filter to either up-convert or down-convert an input signal frequency, but in receiver systems they are more commonly used to down-convert an input signal, known as radio frequency (RF) signal, to a lower frequency, known as the intermediate frequency (IF), to allow for a simpler receiver design. A side effect of using mixers is that in addition to generating their own noise and converting frequencies of signals and noise in the desirable input frequency band, they also frequency-convert noise in other harmonic side bands (HSBs), which all appear at the mixer output. Non-linear circuits also react to signals in their harmonic side bands and therefore can be considered as a special subset of mixers. Mixers can be made with any non-linear circuits. For example, for noise-parameter-measurement purposes, a nonlinear power amplifier can be considered as a mixer with the input signal, local oscillator (LO) signal, and the output signal being at the same frequency.

In systems where mixer noise affects the overall sensitivity, an understanding of how to minimize noise of a given mixer can be important. Noise figures of mixers are generally poor due to noise from HSB frequencies being converted to the output IF. Several noise-parameter measurement techniques have been developed for linear two-port networks, such as low noise amplifiers (LNAs), transistors, etc., but not for frequency conversion devices. Measurement of mixer noise parameters is becoming important as there are now some circuits, which avoid the use of low noise amplifiers (LNA) in front of mixers to save power, reduce design complexity, and/or lower costs. Using a mixer in front of a receiver down converts noise from various HSBs to its output. This makes signal detection more difficult. In addition, noise at the output of non-linear circuits, such as power amplifiers, couples to inputs of nearby receivers thereby reducing their sensitivity.

Currently, most studies on mixer noise are from the circuit design perspective, where noise figure (NF) of a mixer is modeled in terms of physical circuit parameters. These methods do not fully characterize the noise contribution of HSBs, and in particular the image frequency (IM) band, to the overall mixer noise figure and do not fully model the sensitivity to mismatch between the optimum admittance (or equivalent impedance or reflection coefficient) and the actual implemented admittance at the HBS frequencies. The previous art fixes the IM port with a fixed admittance $Y_i$. Fixing this admittance effectively reduces the mixer to a two-port model where effective two-port noise parameters are solved for. In general these effective two-port noise parameters are dependent on a fixed admittance $Y_i$. Thus, the noise model is not complete as effects of all impedance terminations on NF are not characterized.

Another approach to modeling the noise of a mixer is done computationally using methods such as combining a conventional time-domain model with circuit noise information; obtaining an equivalent circuit model for transistors to generate a bias-dependent model, the bias-dependent model being used as a seed to obtain noise values for a large signal model; and lastly, applying an impedance field method to high and low frequency microscopic noise processes. The total noise power contributed at the intermediate frequency (IF) output of the mixer from each such HSB s, each of which is represented with an equivalent input port, is represented by a correlation matrix of equivalent spectral noise currents and/or voltages at several different frequencies and bias points of transistors under large signal operation. These methods are ideal for the computation of mixer noise correlation coefficients in a simulated environment; however, no method exists to measure the corresponding mixer noise parameters or noise correlation coefficients for each port.

A need therefore exists for a method and system that allows for the modeling and, more importantly, for measuring the noise behavior of each HSB in order to determine circuit operating conditions that minimize the noise of systems including mixers. A need exists for a method to predict system level noise performance, which is better than conventional techniques. A need exists for a method to determine how sensitive the NF of the frequency conversion device is to LO phase noise. A need exists to minimize noise contribution of each HSB to the output of the frequency conversion device by matching HSB to optimal impedances. A need exists for a method to calculate the tradeoff between input power matching and NF. If a LNA is not being used, a need exists for a method to design antennas with better system signal to noise ratio. A need exists to fully model the sensitivity mismatch between the optimum admittance and the actual implemented admittance at HSB frequencies. A need exists for a method that allows for the full characterization of all HSB frequencies, modelled by corresponding HSB ports, by giving each port its own set of noise parameters. A need exists to determine optimum noise matching for non-linear devices.

BRIEF SUMMARY OF THE INVENTION

The following presents a simplified summary of the invention in order to provide a basic understanding of some aspects of the invention. This summary is not an extensive overview of the invention. It is not intended to identify critical elements of the invention or to delineate the scope of the invention. Its sole purpose is to present some concepts of the invention in a simplified form as a prelude to the more detailed description that is presented elsewhere.

The method according to the present invention of combining noise parameters into the mixer noise model is not specific to the actual mixer topology being modeled and applies in a general case of having no information regarding the internal circuit parameters of a given mixer. A method according to the present invention develops a noise model for a mixer in terms of several two-port noise parameters based on the mixer multi-port model, in which each input port represents an HSB frequency band, and a measurement procedure for the determination of these noise parameters. In an embodiment, the method of the present invention is applied to non-linear devices.

The benefit of using this method is that it allows for the measurement of the mixer noise parameters and thus the noise correlation coefficients that fully characterize the noise behavior of a given device. Representing the mixer noise behavior in terms of noise parameters, instead of noise-correlation coefficients, is beneficial as it directly relates mixer NF to the output impedance of the circuit preceding the mixer and thus permits proper design of a matching network located between the two circuits.

Noise parameters have the advantage of being intuitive as they explicitly define the optimal matching conditions at each HSB of a device to minimize its noise factor. The proposed mixer noise model permits treating a mixer as a "black box" component. This model becomes more relevant when the IF frequency is large and thus the signal-source impedance experiences significant variation from radio frequency (RF) to IM frequency.

The mixer noise parameter extraction is based on the standard tuner-based noise-parameter measurement systems used for linear two-port devices, such as LNAs, but modified such that measured output noise power is recognized as a sum of HSB noise contributions in the mixer noise factor expression. The standard tuner-based noise-parameter measurement methods were incomplete if utilized with mixers, in which all HSB noise parameters would need to be solved independently. The method herein treats a mixer as a multi-port device having one port for each HSB. HBSs are exemplified herein by RF and IM frequency HSBs, it will however be appreciated that the method can be applied to any HSBs.

When considering only RF and IM frequency HSBs, the method having two sets of noise parameters, represents the noise figure of a mixer without the need for converting the mixer from a three-port representation to a two port representation. In addition, the method fully characterizes the mixer noise behavior for any termination at RF and IM ports.

In embodiments, the disclosure relates to a method for determining the noise parameters of a frequency conversion device under test having at least two harmonic side bands in a test setup including an admittance tuner and a receiver. The method includes determining the scattering parameters of the input tuner; sweeping through a predetermined range of input tuner admittances in the test setup and determining the output noise power at the receiver with each admittance and extracting the receiver noise parameters; determining the vector conversion parameters of the frequency conversion device under test for each harmonic side band outside of the test setup; sweeping through a predetermined range of input tuner admittances; and measuring the noise power at the output of the frequency conversion device under test in the test setup with the receiver to determine the noise parameters of the frequency conversion device under test.

In embodiments, the disclosure relates to a method of measuring noise parameters of a frequency conversion device in a test setup including a tuner and a receiver. The method comprises: (a) setting a tuner state to one of a set of tuner states; (b) setting a sweep parameter to a value in a set of multiple sweep parameter values; (c) measuring noise power of the receiver at the tuner state and sweep parameter value without the frequency conversion device in the test setup; (d) repeating steps (b) and (c) for a different sweep parameter value in said set of multiple sweep parameter values until noise power of the receiver has been measured for all sweep parameter values in said set and extract the receiver noise parameters; (e) setting a sweep parameter to a value in a second set of multiple sweep parameter values; and (f) measuring noise power at an output of the frequency conversion device at said tuner state and sweep parameter value with the frequency conversion device in the test setup. In an embodiment, the method further includes repeating steps (e) and (f) until noise power has been measured for each of said tuner states in said set of tuner states, and wherein the noise power of the frequency conversion device is measured as a function of the sweep parameter for said set of parameter values for one tuner state at a time. In an embodiment, the sweep parameter is admittance. In an embodiment, the sweep parameter is reflection coefficient. In an embodiment, the sweep parameter is impedance.

In an embodiment, the tuner is a mechanical tuner, and each tuner state in said set of tuner states corresponds to one mechanical setting of said mechanical tuner.

In an embodiment the method further includes determining the scattering parameters of the input tuner.

In an embodiment, the method further includes determining the vector conversion parameters of the frequency conversion device under test.

In an embodiment, the tuner is a solid state tuner, using a plurality of solid state control elements.

In an embodiment, the test setup includes a noise analyzer, and the noise power of the receiver and the frequency device under test are collected for calibrating or extracting noise parameters of the noise analyzer.

In an embodiment, the noise power of the receiver and frequency conversion device under test are used to determine noise parameters of a device under test at a harmonic side band.

In an embodiment, the noise power measurements are sufficient to determine a set of noise parameters of the receiver, including: gain of the receiver and the noise figure minimum of the receiver.

In an embodiment of the methods herein, the frequency conversion device has LO, RF and IF at the same frequencies. In an embodiment, the methods herein further include measuring output noise in the band just next to the band where an amplified LO signal appears at the IF port. When LO appearing at the IF port is large, it may not be possible to measure a small amount of noise power at the same frequency as that of the LO. Therefore, in some situations the noise close to the frequency of the LO, but not at exactly the same frequency, can be measured. This is acceptable for many devices, since noise parameters do not exhibit large frequency dependence.

In an embodiment, the method further includes measuring output noise with an averaging power meter at which output the amplified LO signal appearing at the IF port averages out. Average power meter can also be called a root mean square (rms) power meter. The term "averages out" refers to a signal, for example the LO signal having an average of zero. In such a case, the averaging power meter would measure zero power due to signal, for example LO signal.

In an embodiment, the method further includes using a coupler to reduce the strengths of the LO signal appearing at the IF port. In an embodiment, the method further includes using a filter to reduce the LO signal appearing at the IF port. "Reducing the strength" herein means that the signal, for example the LO signal, is sufficiently reduced so that it does not make the measuring equipment non-linear and thus inaccurate.

In an embodiment, the invention provides an automated test setup, wherein the methods herein are implemented by computer software algorithms installed on a test setup. In an embodiment, the test setup includes an admittance tuner and a receiver. In an embodiment, the test set up further comprises a noise analyzer.

The drawings constitute a part of this specification and include exemplary embodiments of the present invention and illustrate various objects and features thereof.

BRIEF DESCRIPTION OF THE DRAWINGS

A further understanding of the invention may be had by reference to the accompanying drawings in which.

DETAILED DESCRIPTION OF THE INVENTION

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. It is also noted that any reference to the words top, bottom, up and down, and the like, in this application refers to the alignment shown in the various drawings, as well as the normal connotations applied to such devices, and is not intended to restrict positioning of the connecting member assemblies of the application and cooperating bone anchors in actual use.

Herein the terms "mixer," "frequency mixer," or "frequency conversion device" are synonymous and refer to being or having at least one electrical circuit that creates new frequencies from frequencies of signals applied to it. A device as used herein contains at least one electrical circuit and thus can be an electrical circuit. A circuit herein includes one or more electrical elements which may be linear or non-linear. Thus, a circuit can be an electrical element. In its simplest form, a device can be an electrical element. A non-linear electrical element is one whose input signal spectra differ from its output spectra through some nonlinear characteristic of the element. Analogously, a non-linear device or circuit is one whose input signal spectra differ from the output spectra through some non-linear characteristic of the device or circuit. The non-linear characteristic could, among others, be a non-linear relationship between currents and voltages or result from subcomponents, for example, elements, of the device or circuit being temporarily toggled from on to off. In an embodiment, a linear device is or contains at least one linear circuit. In an embodiment, a non-linear device is or contains at least one non-linear circuit.

Figure 1:
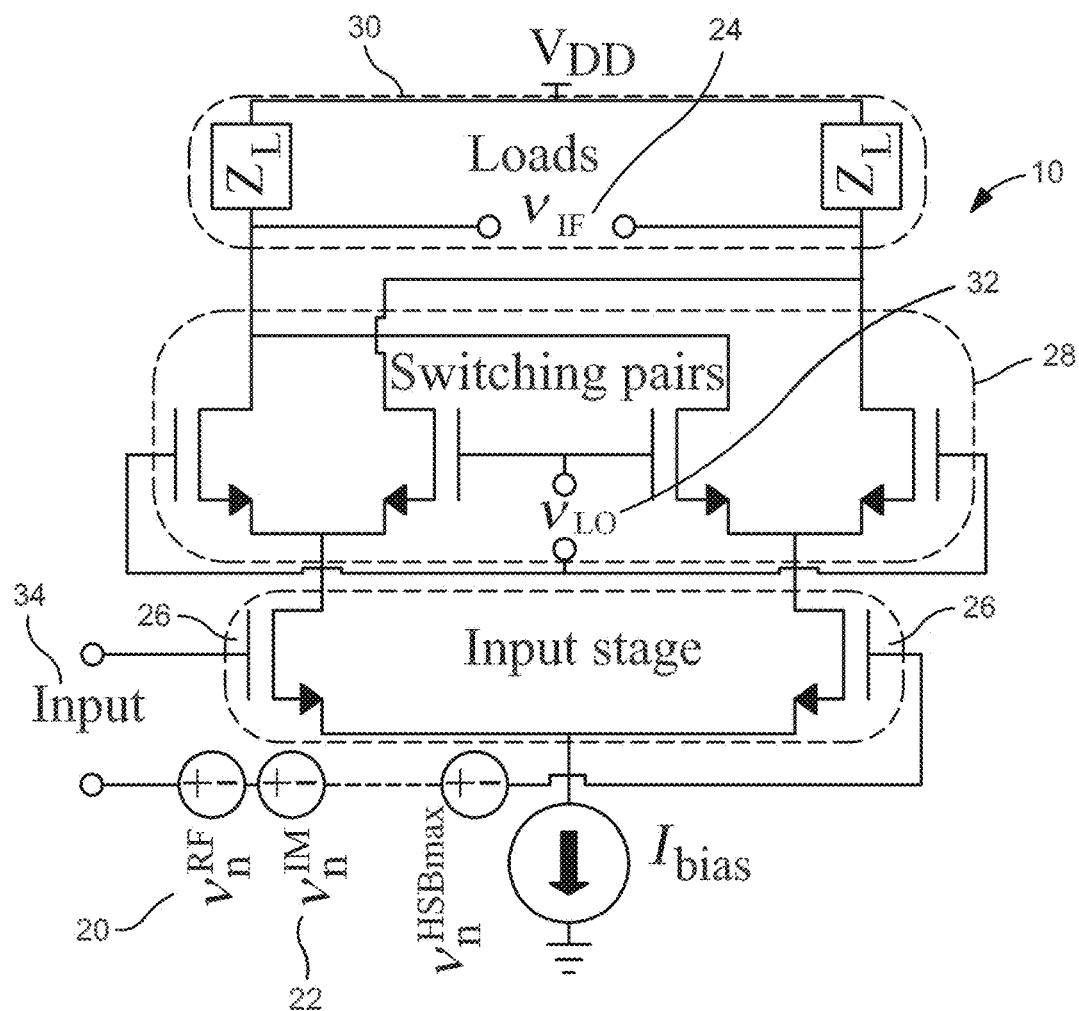
FIG. 1 is a circuit diagram of a typical Gilbert cell mixer including input-referred noise voltages due to RF, IM and other HSB frequencies up to some maximum HSB, identified as $HSB_{max}$.

It will be appreciated that FIG. 1 teaches by way of example and not limitation. The number of circuit components, e.g., elements, may be increased or decreased with respect to what is shown. FIG. 1 is a Gilbert circuit 10 and will teach as way of example and not limitation a method for determining its noise parameters. The down-converting mixer circuit 10 includes three-ports, in which the input port 34 accepts a radio frequency (RF) voltage input. Input referred noise generated by mixer 10 is represented at RF by noise voltage 20 and a fundamental image frequency (IM) by voltage input 22 in addition to other HSBs. Mixer output is at an intermediate frequency (IF) represented by output voltage 24, and an oscillator input is applied at the LO port 32. Gilbert cell mixers 10, such as the double-balanced Gilbert cell mixer 10 shown in FIG. 1, consist of input stage transistors 26, switching pair transistors 28, and loads 30. The switching pair transistors 28 are driven by a strong local oscillator (LO) signal 32 that quickly cycles the switching-pair transistors 28 from ON to OFF commutating currents generated by a small input signal 34, which is applied to the input transistors 26. This is equivalent to a multiplication of the input signal 34 by the LO signal 32, which results in the generation of mixing products.

The main noise contributors in the mixer 10 shown in FIG. 1 are the input stage transistors 26, the switching-pair transistors 28, the LO 32, and the loads 30. There are several know factors concerning noise, one factor is that noise generated by transistors is white. White noise being signals regarded as a sequence of serially uncorrelated random variables with zero mean and finite variance. Another factor known is that output time-averaged noise power spectrum density (PSD) of noise generated by the input-stage transistors 26 is linearly proportional to the PSD of the noise generated by each transistor. Another factor is that output time-averaged noise contributions from various HSBs are uncorrelated. Another factor is that the switching-pair transistors 28 only contribute noise during the interval when they are all ON and their output time averaged noise PSD is proportional to the current drawn by the mixer and inversely proportional to the LO voltage swing. Another factor is that LO noise can affect the mixer noise performance.

Figure 2:
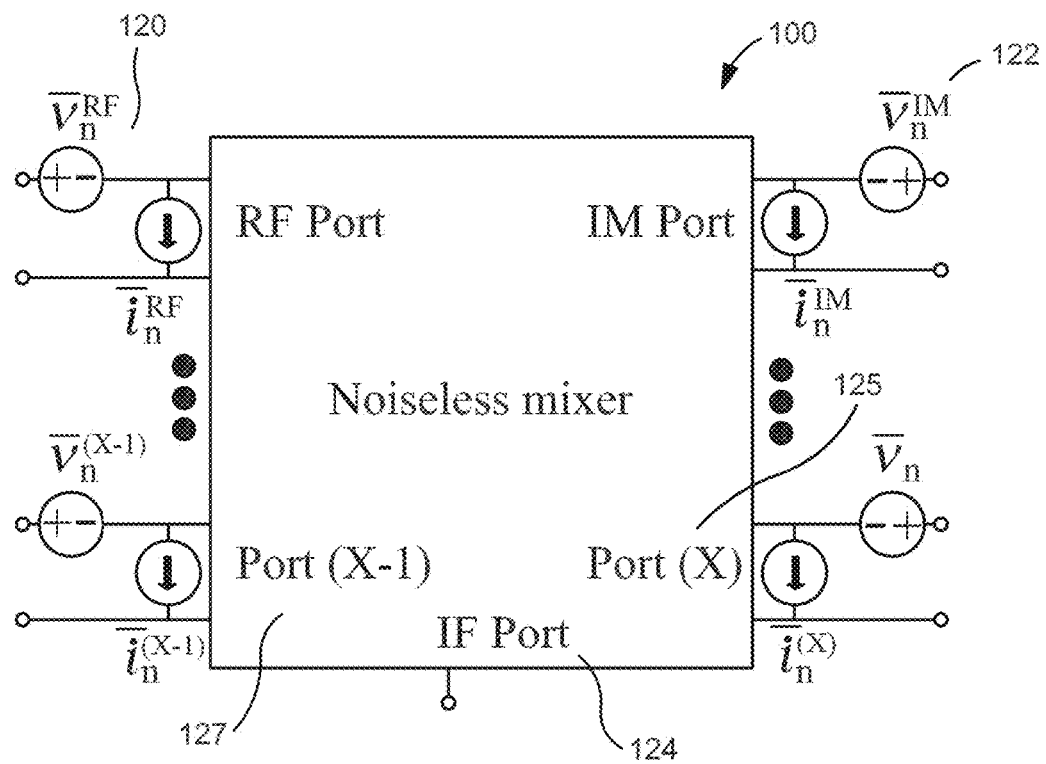
FIG. 2 is a noise model of a multi-port mixer according to the present invention.

The mixer noise model has different sets of noise parameters for every input HSB frequency band that contributes noise to the output, see FIGS. 1-2. There are many different types of mixers that are used in practice and the method according to the present invention is applicable to all mixers or frequency conversion devices.

Figure 4:
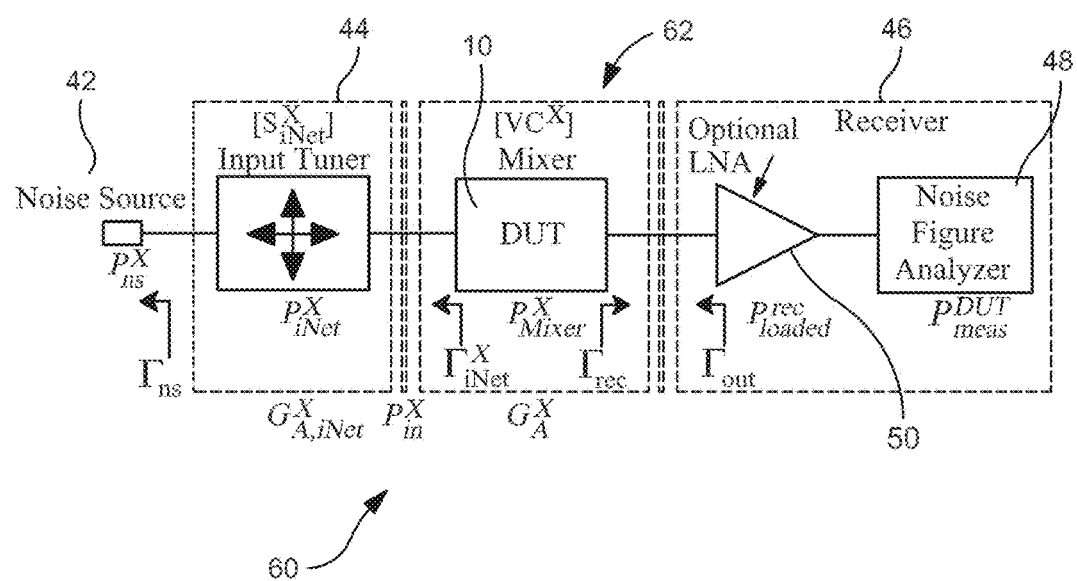
FIG. 4 is a block diagram of an exemplary mixer noise parameter measurement system according to the present invention.

Noise contributions from different HSBs can be treated individually, a mixer 100, such as the mixer 10 seen in FIG. 1 or the mixer under test 62 seen in FIG. 4, is represented as a multi-port linear network 100, in which one port represents the IF output 124 and the other ports are assigned to uncorrelated HSBs, represented by IM Port 122, Port X−1 127, and Port X 125, as shown in FIG. 2, where noise of the mixer 100 for each HSB is modeled with input-referred noise voltages and noise currents. As for a noisy two-port linear network, these noise voltages and noise currents correspond to noise parameters of the mixer in FIG. 1.

Using the definition of a noise factor, the single-side-band (SSB) noise factor of a mixer, $F_{Mixer}$, can be written as:

$$F_{Mixer} = \frac{SNR_{in}}{SNR_{out}} \tag{1}$$

where the available signal-to-noise ratio (SNR) at the input, $SNR_{in}$, is:

$$SNR_{in} = \frac{P_s^{in}(f_{RF})}{P_n^{in}(f_{RF})} \tag{2}$$

where the input SNR is ratio of the input signal available from the signal source, $P_s^{in}(f_{RF})$, and the input referred noise power at the RF port, $P_n^{in}(f_{RF})$. The output SNR is:

$$SNR_{out} = \frac{P_s^{in}(f_{RF}) G_A^{RF}}{\sum_{X=RF}^{HSBmax} G_A^X [P_n^{in}(f_X) + P_n^{Mixer}(f_X)]} \tag{3}$$

where 'X' identifies the input HSBs port whose noise is hetero-dyned to the output IF 124, $P_n^{in}(f_x)$ is the input-referred noise power at port X, $P_n^{Mixer}(f_x)$ is the input-referred mixer noise at port X, $G_A^X$ is the available conversion gain at port X, $G_A^{RF}$ is the available conversion gain at the port RF 120, and $HSB_{max}$ indexes the highest HSB frequency relevant for a particular mixer. The input-referred noise powers at different HSB ports are uncorrelated in Equation (3).

The noise factor of the mixer, $F_{Mixer}$, may also be expressed as:

$$F_{Mixer} = \frac{1}{G_A^{RF}} \sum_{X=RF}^{HSBmax} G_A^X \frac{P_n^{in}(f_X) + P_n^{Mixer}(f_X)}{P_n^{in}(f_{RF})} \tag{4}$$

where the terms identified by $F_x$ are the noise factor contributions from their respective HSBs. The noise factor of the mixer, $F_{Mixer}$, (or noise figure $NF_{Mixer}=10 \log(F_{Mixer})$) can be expressed in terms of noise parameters for each HSB, X as: minimum noise factor, $F_{min}^X$, equivalent noise resistance, $R_n^X$, and optimum admittance for minimum noise, $Y_{opt}^X = G_{opt}^X + jB_{opt}^X$, and in terms of the source admittance generated by an input network driving the mixer: $Y_{iNet}^X = G_{iNet}^X + jB_{iNet}^X$, as:

$$F_{Mixer} = \frac{1}{G_A^{RF}} \sum_{X=RF}^{HSBmax} G_A^X \left( F_{min}^X + \frac{R_n^X}{G_{iNet}^X} |Y_{iNet}^X - Y_{opt}^X|^2 \right). \tag{5}$$

Mixers are frequency conversion devices and instead of conventional scattering or S-parameters, a different set of parameters, known as the vector-conversion (VC) parameters, is used. The VC-parameters for a 2-port frequency conversion device are defined as $$[VC^X] = \begin{bmatrix} VC_{11}^X & VC_{12}^X \\ VC_{21}^X & VC_{22}^X \end{bmatrix} = \begin{bmatrix} \frac{b_1^X}{a_1^X} & \frac{b_1^X}{a_2^{IF}} \\ \frac{b_2^{IF}}{a_1^X} & \frac{b_2^{IF}}{a_2^{IF}} \end{bmatrix} \tag{6}$$

where $a_{1,2}^X$ and $b_{1,2}^X$ are incident and reflected traveling waves, respectively, for each HSB. The VC-parameters allow for the calculation of the cross-frequency available conversion gains by $$G_A^X = \frac{1-|\Gamma_S^X|}{|1-\Gamma_S^X VC_{11}^X|^2} \frac{|VC_{21}^X|^2}{1-|\Gamma_{out}|^2} \tag{7}$$

where $\Gamma_{out}$ is the output reflection coefficient, $\Gamma_s^X$ is the signal source, s, reflection coefficient at port X, and $VC_{11}^X$ and $VC_{21}^X$ are the VC-parameters at HSB port X 125.

The measurement of the noise parameters of the circuit (FIG. 4) attached to the mixer 62 must be known to be de-embedded from the mixer measurements to arrive at mixer only noise parameters.

Figure 3:
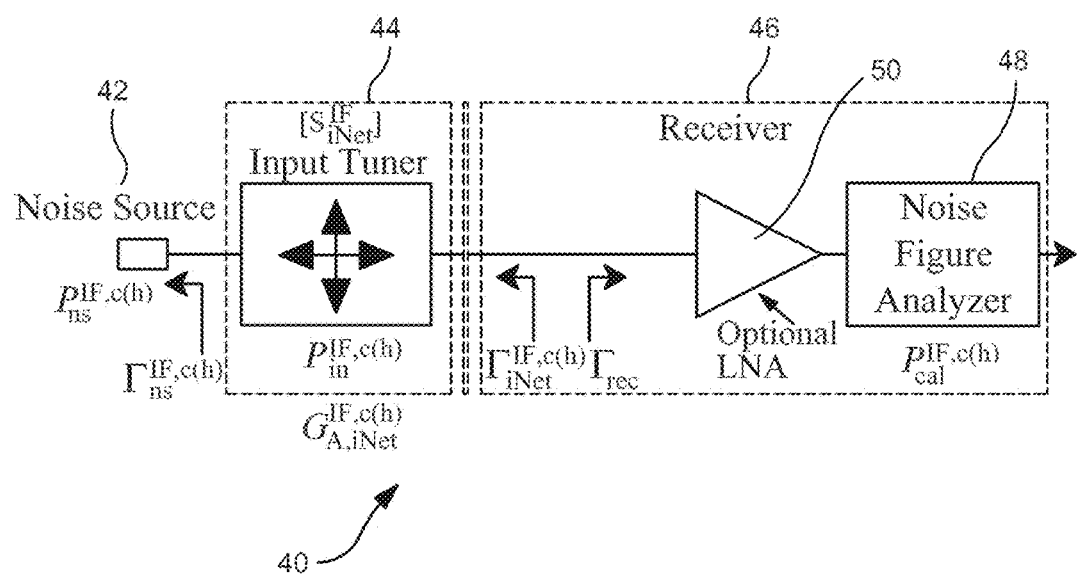
FIG. 3 is a block diagram of an exemplary receiver calibration system according to the present invention.

Referring to FIG. 3, a calibration circuit 40 is illustrated. The calibration circuit 40 includes the circuitry to be connected to a mixer 62 (see FIG. 4) and includes a noise source 42, an input tuner 44, and a receiver 46. The input tuner 44 may be made of two transmission lines with a shunt capacitor in between, the state being varied by moving the location of the shunt capacitor. The receiver 46 includes a noise figure analyzer 48 and may additionally include a LNA 50 to reduce the noise figure analyzer noise figure. Some noise figure analyzers come with this feature 50. The circuit block diagram of FIG. 3 is used in order to determine the S-parameters at the IF frequency of both the input tuner 44 and receiver 46, as well, as the internal part of the receiver transducer gain, $G_{rec}$, which cannot be measured directly, prior to the addition of a mixer to the circuit.

In this system, the tuner noise contribution is found directly from the S-parameters, using the equation $$P_{iNet}^{X,c(h)} = k\Delta f T_0 \left( \frac{1}{G_{A,iNet}^{X,c(h)}} - 1 \right) \tag{8}$$

where k is Boltzmann's constant, $T_0$ is the reference temperature, $\Delta f$ is the noise bandwidth, and the available gain $G_{A,iNet}^{X,c(h)}$ is found from the S-parameters for each HSB at hot (h) or cold (c) states of the noise source 42 as $$G_{A,iNet}^{X,c(h)} = \frac{1 - |\Gamma_{ns}^{c(h)}|^2}{|1 - \Gamma_{ns}^{c(h)} S_{11}^{X,iNet}|^2} \frac{|S_{21}^{X,iNet}|^2}{1 - |\Gamma_{iNet}^{X,c(h)}|^2} \quad (9)$$

where $\Gamma_{ns}^{c(h)}$ is the noise source 42, ns, reflection coefficient at either cold or hot temperatures, $S_{21}^{X,iNet}$ and $S_{11}^{X,iNet}$ are the S-parameters at port A, $\Gamma_{iNet}^{X,c(h)}$ is the output reflection coefficient of the two-port network at port X, and is defined as:

$$\Gamma_{iNet}^{X,c(h)} = S_{22}^{X,iNet} + \frac{S_{21}^{X,iNet} S_{12}^{X,iNet} \Gamma_{ns}^{c(h)}}{1 - S_{11}^{X,iNet} \Gamma_{ns}^{c(h)}} \quad (10)$$

Figure 5:
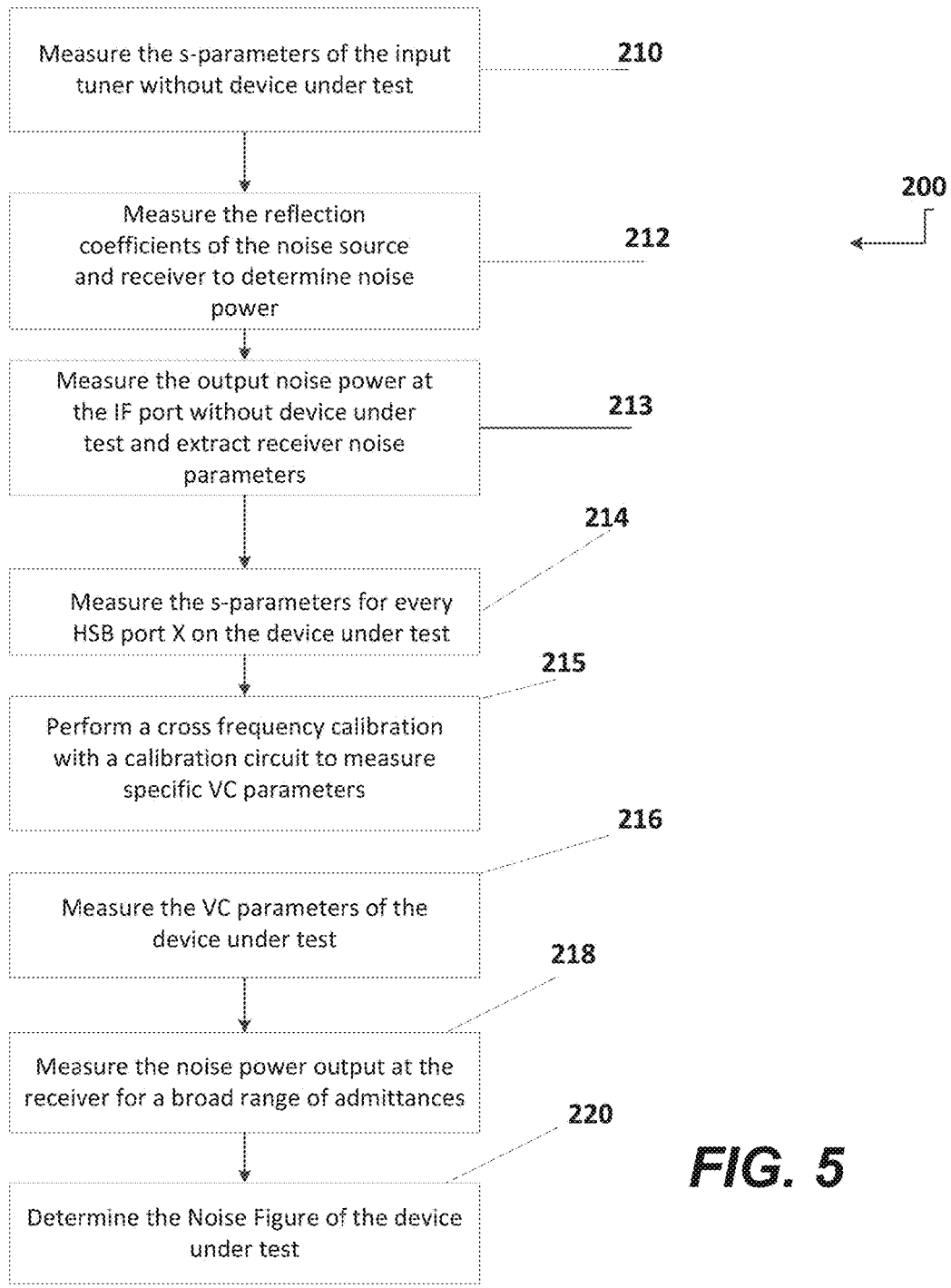
FIG. 5 is a flow diagram chart of a mixer noise parameter extraction method.

Referring to FIG. 5, a method 200 of extracting mixer noise parameters is illustrated. At step 210, the S-parameters of the input tuner $[S_{iNet}^{IF}]$ are measured with a vector network analyzer (VNA). It is foreseen that step 210 may be repeated several times and the measurements averaged. The y-factor noise-parameter measurement method is presumed, but not required, for receiver calibration, therefore, many of the equations take into account a cold and hot temperature.

At step 212, the reflection coefficients, $\Gamma_{ns}^{c(h)}$ of the noise source 42 and $\Gamma_{rec}$ of the receiver are measured in the calibration circuit seen in FIG. 3, as well as, both at the hot (h) and cold (c) states if using the y-factor method. From these measurements, the input network output reflection, $\Gamma_{iNet(i)}^{IF,c(h)}$, can be calculated by using Equation (10), the available gains of the input network 44, $G_{A,iNet(i)}^{IF,c(h)}$, can be calculated by using Equation (9), the receiver input noise power, $P_{iNet}^{X,c(h)}$, can then be calculated by using Equation (8), each calculation where X is at the IF port. Now that the input tuner noise has been calculated, the receiver noise must be determined.

At step 213, measure the output noise powers of the IF port 120 at the receiver 46 with the noise figure analyzer 48 seen in FIG. 3. The output noise power is expressed as:

$$\frac{P_{cal(i)}^{IF,c(h)}}{kT_0\Delta f} = \quad (11)$$

$$M_{(i)}^{c(h)} G_{rec} \left[ \frac{P_{in(i)}^{c(h)}}{kT_0\Delta f} + \left( F_{min}^{rec} - 1 + + \frac{4R_n^{rec}}{Z_0} \frac{|\Gamma_{opt}^{rec} - \Gamma_{iNet}^{IF,c(h)}|^2}{|1 + \Gamma_{opt}^{rec}|^2 (1 - |\Gamma_{iNet}^{IF,c(h)}|^2)} \right) \right].$$

The optimal receiver reflection coefficient is expressed as:

$$\Gamma_{opt}^{rec} = \frac{(Y_0 - Y_{opt}^{rec})}{(Y_0 + Y_{opt}^{rec})} \quad (12)$$

where $Y_0$ is the characteristic admittance, typically $$\frac{1}{50\Omega} \cdot M_{(i)}^{c(h)} G_{rec},$$

represents the receiver transducer gain, $G_T^{rec}$, for each tuner setting i and each state of the noise source 42.

The expression for the receiver 46 transducer gain, $G_T^{rec}$ is:

$$G_T^{rec} = \underbrace{\frac{1 - |\Gamma_{iNet(i)}^{IF,c(h)}|^2}{|1 - \Gamma_{iNet(i)}^{IF,c(h)} \Gamma_{rec}|^2}}_{M_{(i)}^{c(h)}} \times \underbrace{\frac{|S_{21}^{rec}|^2 (1 - |\Gamma_L^{rec}|^2)}{|1 - \Gamma_L^{rec} S_{22}^{rec}|^2}}_{G_{rec}}. \quad (13)$$

which includes the expression of the impedance mismatch between the input tuner and the receiver, $M_{(i)}^{c(h)}$, and the portion, which is identified as $G_{rec}$, is due to internal parameters ($S_{22}^{rec}$, $S_{22}^{rec}$, and $\Gamma_L^{rec}$) of the receiver 46 that are not measurable on their own and $M_{(i)}^{c(h)}$ is the measurable portion of the transducer gain, $G_T^{rec}$. It is foreseen that a least-squares method is used to determine the receiver's unknown noise parameters, $F_{min}^{rec}$, $R_n^{rec}$, $Y_{opt}^{rec}$, and $G_{rec}$. To extract the unknown noise parameters and $G_{rec}$ from Equation (11), noise power measurements for at least four tuner settings (i.e. admittances) are required. These receiver noise parameters and $G_{rec}$ are used during extraction of the noise parameters of a mixer in the next part of the method.

Referring to FIG. 4, a mixer under test 62 has been added to the calibration circuit 40 as seen in FIG. 3. FIG. 4 shows the measurement setup used to extract all noise parameters of a mixer 62. The mixer noise parameter measurement system 60 includes a noise source 42, an input tuner 44, and a receiver 46 of FIG. 3, but further includes the mixer or device under test (DUT) 62, which can be the mixer 10 as seen in FIG. 1. The receiver 46 in FIG. 4 is identical to receiver 46 in FIG. 3 and includes a noise figure analyzer 48 and may additionally include a LNA 50 to reduce the noise figure analyzer noise figure. The calibration of the receiver 46 has been completed, and the mixer noise extraction method is broken down further below.

At step 214 the input tuner S-parameters $[S_{iNet}^X]$ are measured for every HSB port (X) on the device under test 62, while not being in the calibration circuit. It is foreseen this can be accomplish with a VNA (not shown). It is foreseen that step 214 may be repeated several times and the measurements averaged. It should be appreciated that step 214 could be combined with step 210.

At step 215, and prior to measuring noise parameters of the device under test 40, a cross-frequency reference plane calibration is performed with a VNA. This is done by following procedures prescribed by VNA manufacturers. A full two port cross-frequency reference plane calibration calibrates the reference plane at input and output for frequencies X and IF.

At step 216, the vector conversion parameters allows for the measurement of $[VC^x]=VC_{11}$, $VC_{21}$, $VC_{12}$, and $VC_{22}$ of the device under test 62 are measured for each HSB port (X) outside of the calibration circuit shown in FIG. 4. However, some VNAs do not have the ability to measure noise parameter, $VC_{12}$ and in such cases $VC_{12}$ may be omitted and assumed to be small, which is valid for many mixers, but is not accurate in general. If this is the case, then at step 215, only X frequencies are desired at the input and IF frequencies are desired at the output. It should be appreciated that step 216 can be combined with steps 214 and 210, and that these steps may be done in any order. It is foreseen that step 216 may be repeated several times and the measurements averaged or the like as is known in the art. It is foreseen that a VNA (not shown) that is capable of measuring the vector conversion parameters of the device under test 62 is used to obtain vector conversion parameters for each required HSB.

At step 218, a broad range of tuner settings and the output noise powers $P_{meas(i)}^{DUT}$ are measured at the receiver 46 with the device under test 62 in FIG. 4. The measurement is performed for each tuner impedance setting that is indexed as 'i'. The tuner 44 is placed at the input of the mixer 62 to generate different reflection coefficients (with corresponding admittances or impedances) at the RF 120 and other HSBs. This process is repeated for several tuner settings generating several device-under-test signal-source admittances (or impedances or reflection coefficients) at all HSBs. The noise contributions of the HSB frequency ports 120, 122, 125, 127 to the output 124 depend on the signal-source admittance at the HSB frequencies, the two-port devices, and the RF-frequency signal-source admittance.

It is foreseen that two sets of measurements may be performed as a cross check: 1) an upper-side-band (USB) LO and 2) a low-side-band (LSB) LO. Since for both measurements, the IF frequency will be kept the same, the two measurements are equivalent to switching RF and IM side bands. Therefore, it is expected that both measurements result in the same noise parameters. As several signal-source reflection coefficients are needed for each HSB to extract noise parameters, it is foreseen that the tuner 44 may be set up for at least 4 times the number of HSBs and presumably many more. Since the phase of the impedance reflection coefficient changes from RF to other HSBs given the same tuner setting, a large combination of signal source impedances at HSBs is attainable.

The output noise power of the system measured by the noise receiver is given as:

$$\frac{P^{DUT}_{meas(i)}}{M_{(i)} G_{rec}} = \sum_{X=RF}^{HSBmax} (P^X_{in(i)} + P^X_{mixer(i)}) G^X_{A(i)} + P^{rec}_{loaded(i)} \quad (14)$$

where $G_{A(i)}^X$ is determined from Equation (9), $P_{mixer(i)}^X$ is the noise power from the mixer at port X, $P_{in(i)}^X$ is the total noise power from the noise source 42 and the tuner at the DUT 62 input expressed as:

$$P_{in}^{X,c(h)} = (P_{ns}^{X,c(h)} + P_{iNet}^{X,c(h)}) G_{A,iNet}^{X,c(h)}. \quad (15)$$

where $G_{A,iNet}^X$ is calculated from Equation (9) and $P_{iNet(i)}^{X,c(h)}$ is calculated from Equation (8) and the noise source 42 power is defined, $P_{ns}^{X,c(h)}$, as:

$$P_{ns}^{X,c(h)} = k \Delta f T_{c(h)} \quad (16)$$

$T_h$ is defined as:

$$T_h = ENR(T_0 + T_c) \quad (17)$$

where ENR is the excess noise ratio of the given noise source 42, which is unique to the specific noise source 42 and calibrated by manufacturer.

The noise power contributed by the receiver when driven by the mixer with its output reflection coefficient $\Gamma_{out(i)}$ and is found from $$\frac{P^{rec}_{loaded(i)}}{kT_0 \Delta f} = F^{rec}_{min} + \frac{4R^{rec}_n}{Z_0} \frac{|\Gamma^{rec}_{opt} - \Gamma_{out(i)}|^2}{|1 + \Gamma^{rec}_{opt}|^2 (1 - |\Gamma_{out(i)}|^2)}. \quad (18)$$

where $F_{min}^{rec}$, $R_n^{rec}$, and $\Gamma_L^{rec}$ are found during the receiver calibration step 213.

At step 220, from Equation (14) and Equation (18), $$\sum_{X=RF}^{HSBmax} (P^X_{in(i)} + P^X_{DUT(i)}) G^X_{A(i)}$$

is found, which relates to $F_{Mixer}$ through Equation (4) and then to the mixer noise parameters through Equation (5).

With n tuner settings, Equation (5) creates a system of n equations. This system of n equations can then be used to solve for the 4 times the number of HSBs unknown noise parameters in Equation (18). As written by way of example, Equation (18) has 8 unknown noise parameters that are non-linear with respect to the noise factor of the mixer, $\Gamma_{Mixer(i)}^{RF,IM}$, therefore a non-linear solution may be found by using known methods such as a non-linear least-squares fit, which utilizes the Levenberg-Marquardt algorithm.

Many bounds can be placed on the possible solutions to speed up the process. For example, $F_{min}^X$, must be greater than 1 and no greater than the minimum measured noise factor; $\angle \Gamma_{opt}^{RF}$ can estimated by assuming that the first term in (18) dominates the minimum trends of $F_{Mixer}^X$ and fundamental relationships $4R_n^X \times G_{opt}^X < F_{min}^X - 1$ must remain for solution.

It will be appreciated that some mixers have LO and RF signals applied to the same physical port. It will also be appreciated that all non-linear circuits produce mixing products and thus can be viewed as mixers. The term mixer herein devices made from non-linear circuits. A power amplifier or a transistor with a large input signal are two examples of such non-linear circuits. "Large input signal" means that the input signal has high enough magnitude so that at least one part of the circuit exhibits non-linear behavior. To measure the noise parameters of such circuits, LO signal is equivalent to the large input signal of the circuit, IF signal is at the same frequency as LO, and RF signal is the input noise.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention. Further, it will be understood that certain features and subcombinations may be of utility and may be employed within the scope of the disclosure. Further, various steps set forth herein may be carried out in orders that differ from those set forth herein without departing from the scope of the present methods. This description shall not be restricted to the above embodiments.

It is to be understood that while certain forms of the present invention have been illustrated and described herein, it is not to be limited to the specific forms or arrangement of parts described and shown.

THE EXAMPLES

Figure 6:
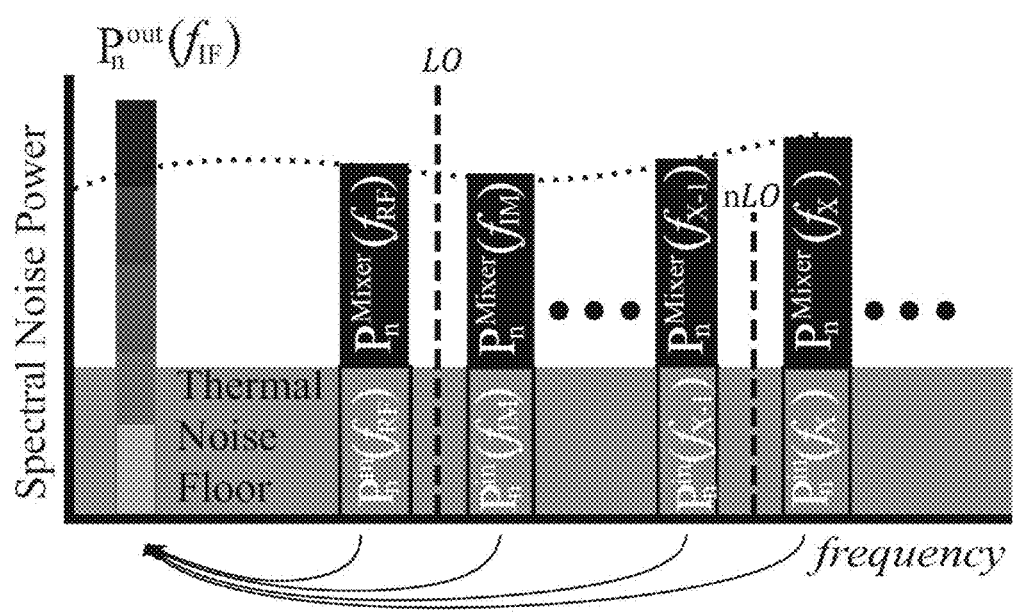
FIG. 6 is an illustration of noise contribution to the IF output of a low-side band down conversion mixer. In this figure, $P_n^{in}(\cdot)$ identify input noise floor at different HSB frequencies.

In systems where mixer noise affects the overall sensitivity, an understanding of how to minimize noise of a given mixer can be important. Noise figures of mixers are generally poor due to noise from harmonic-side-band (HSB) frequencies being converted to the output frequency as illustrated in FIG. 6. In contrast, several noise-parameter measurement techniques have been developed for linear two-port networks, such as low noise amplifiers (LNAs) and transistors [1]-[10]. These measurement techniques, however, have not been applied to mixers. Therefore, a "black-box" method, similar to existing methods for LNAs, for modeling and, more importantly, measuring the noise behavior of each such HSB is desirable in order to determine circuit operating conditions that minimize the noise of circuits like mixers.

Currently, most studies on mixer noise are approached from the circuit design perspective [11], [12], where noise figure of a mixer is modeled in terms of physical circuit parameters. Another approach to modeling the noise of a mixer is done computationally using methods described in [13]-[15]. In these studies, mixer noise is represented by a multiport model that considered each noise-contributing HSB as a linear port. The total noise power contributed at the IF output of the mixer from each such input port is represented by a correlation matrix of equivalent spectral noise currents and/or voltages. Reference [13] related these correlation matrix coefficients to the noise parameters of a single-transistor mixer at several different frequencies and bias points of a FET under large signal operation. Therefore this approach of combining noise parameters into the mixer noise model is very specific to the mixer topology being modeled and does not apply in a general case of having no information regarding the internal circuit parameters of a given mixer. However, the multi-port models and noise correlation matrix representations outlined in [13]-[15] are generic to all frequency converting devices, such as mixers. These are useful for the computation of mixer noise correlation coefficients in a simulated environment; however, to our knowledge, no method of measuring noise correlation coefficients exists. Therefore, no method exists to measure the corresponding mixer noise parameters for each port noise correlation coefficients.

A measurement approach was reported in [16] employing the multi-port noise model by representing a down-converting mixer with a three-port model, in which the ports were associated with an RF frequency, the fundamental image (IM) frequency, and an intermediate (IF) frequency. The goal was to determine the optimal noise performance of a Superconductor-Insulator-Superconductor (SIS) mixer by determining its noise parameters, however traditional noise parameters can only be applied to a two-port device. To construct the model, an input network, which provided a known admittance at the IM frequency, was used thus converting the mixer to a two-port network, whose noise parameters were determined using standard methods. This procedure was repeated for several admittances at the IM frequency, and the noise parameters of each associated two-port network were found. This work reported that the input loading conditions at both the RF and IM frequency bands altered the two-port noise parameters. This process provides a useful measurement setup for determining the optimal IM frequency admittance that minimizes noise figure of the mixer.

Reference [16] demonstrated that the noise contribution of the IM frequency port to the output depends on the signal-source impedance at IM frequency and, as expected from two-port devices, the RF-frequency signal-source impedance affects the mixer noise as well. However, the method in [16] does not fully characterize the noise contribution of the IM-frequency band to the overall mixer noise figure and does not fully model the sensitivity to mismatch between the optimum admittance and the actual implemented admittance at the IM frequency. Thus, the model is not complete as effects of all impedance terminations on noise figure are not characterized.

In this work, a noise model for a mixer in terms of several two-port noise parameters is developed based on a mixer multi-port model, and a measurement procedure for the determination of these noise parameters is described. The proposed mixer noise model has different sets of noise parameters for every input frequency band that contributes noise to the output, see FIG. 6. A benefit of using this method is that it allows for the measurement of the mixer noise parameters and thus noise correlation coefficients that fully characterize the behavior of noise of a given device. Representing the mixer noise behavior in terms of noise parameters, instead of noise-correlation coefficients, is beneficial as they directly relate mixer noise figure to the signal-source impedance of the circuit preceding the mixer and thus permit proper design of a matching network located between the two circuits. The mixer noise model and measurement procedure are verified with simulations as described in Example 1 and experimentally validated in Example 2. A list of symbols and notations is given in Appendix A.

Example 1: Mixer Noise Simulation

The purpose the following simulations is to determine whether the noise parameters proposed in Equation 7 can be measured using the procedure in described herein (see FIG. 5). A Gilbert cell mixer was designed in IBM 0.13-μm CMOS as shown in FIG. 1. The mixer had an LO of 2.4 GHz, RF of 1.9 GHz, and an IF of 500 MHz. The RF port and IF port were terminated with ideal baluns for single-ended simulations. A harmonic balance simulation of the entire measurement procedure was carried out in Agilent's Advanced Design System (ADS). This harmonic balance simulation considers sources of noise of each component in FIG. 5, and treats the mixer in FIG. 1 as a "black box." The particular design in FIG. 1 is provided as an example so that the noise behavior of the DUT used to test the measurement setup could be reproduced.

Table I displays values of the "measured" VC-parameters, receiver properties, and noise source properties. Since the device is an active mixer with very high reverse isolation to simplify the "measurement" procedure V $C_{12}$ was set to zero. This simplification is important because our measurement equipment discuss herein is only capable of measuring forward conversion gain V $C_{21}$. Setting V $C_{12}=0$ makes the simulated measurements representative of real measurements in Example 2. Additionally if V $C_{12}=0$ then mixers output reflection coefficient Γout(i) depends only on V $C_{22}$.

A model for a mechanical impedance tuner is placed at the input of the mixer to generate different reflection coefficients at the RF and other HSBs. The "tuner" was represented by two ideal transmission lines with a shunt capacitor in between. The combined length of the two transmission lines was fixed but the location of the shunt capacitor separating them was varied. The simulated DUT "measurement" swept the "tuner" impedance over 511 different states that were uniformly distributed over a Smith chart. The noise factor of the mixer for each such state, FMixer(i), was then extracted using the measurement procedure. The DUT "measurements" employ the direct cold noise parameter extraction method described in [7]. The results are shown with a black line in FIG. 7 where the "measured" noise factor is plotted against the phase of the "tuner" output reflections:

$\Gamma_{iNet}^{RF}$ and $\Gamma_{iNet}^{IM}$, where $\Gamma_{iNet}^{X} = (Y_0 - Y_{iNet}^{X})/(Y_0 + Y_{iNet}^{X})$ and $Y_{iNet}^{X} = G_{iNet}^{X} + jB_{iNet}^{X}$.

The "measured" noise factor and "measured" input reflection coefficients are passed into the noise factor equation (5) to produce equation (20) where only RF and IM HSBs were chosen because all other conversion gains were less than a 5% of the RF and IM conversion gains and thus they were not contributing significant amount of noise. Equation (20) has 8 unknown noise parameters that are non-linear with respect to the noise factor of the mixer. Therefore a non-linear solution was found by using Matlab's non-linear least-squares fit, which utilizes the Levenberg-Marquardt algorithm [25], [26]. Many bounds can be placed on the possible solutions to speed up the solver. For example, $\Gamma_{min}^{RF}$ and $\Gamma_{min}^{RF}$ must be greater than 1 and no greater than the minimum measured noise factor. Estimates on the $\angle \Gamma_{opt}^{RF}$ can also be made by assuming that the first term in equation (20) dominates the minimum trends of $\Gamma_{Mixer}^{RF,IM}$ in FIG. 7. Also fundamental relationships:

$$4R_n^{RF} \times G_{opt}^{RF} < F_{min}^{RF} - 1 \text{ and}$$

$$4R_n^{IM} \times G_{opt}^{IM} < F_{min}^{IM} - 1 \text{ must hold for all solutions}$$
[27]-[29].

The extracted noise parameters are shown in Table II. For comparison a least square solution was also found using only a single set of noise parameters from:

$$F_{Mixer(i)} = F_{min}^{single} + \frac{R_n^{single}}{G_{iNet(i)}^{RF}} |Y_{iNet(i)}^{RF} - Y_{opt}^{single}|^2$$

TABLE I

ADS SIMULATED MEASUREMENT SYSTEM

| Noise Source | $\Gamma_{na}^c$ | $\Gamma_{na}^h$ | | | ENR* | |
|---|---|---|---|---|---|---|
| f1F | 0.022∠144° | 0.019∠140° | | | 5 dB | |

| Receiver | $S_{11}^{rec}$ | $S_{21}^{rec}$ | $S_{12}^{rec}$ | $S_{22}^{rec}$ | $F_{min}^{rec}$ | $R_n^{rec}$ | $\Gamma_{opt}^{rec}$ |
|---|---|---|---|---|---|---|---|
| f1F | 0.057∠224° | 10∠180° | 0 | 0 | 2 | 20 | 0.15∠-265° |

| Mixer | $VC_{11}$ | $|VC_{21}|$ | $VC_{12}$ | $VC_{22}$ |
|---|---|---|---|---|
| RF input | 0.0028 + j0.0164 | 6.7786 | 0 | 0 |
| IM input | 0.7680 + j0.4912 | 1.8440 | 0 | 0 |
| 2nd harmonic lower side band | 0.9790 + j0.1496 | 0.0580 | 0 | 0 |
| 2nd harmonic upper side band | 0.9917 + j0.1283 | 0.0501 | 0 | 0 |
| 3rd harmonic lower side band | 0.9966 + j0.0825 | 0.0316 | 0 | 0 |
| 3rd harmonic upper side band | 0.9971 + j0.0755 | 0.0292 | 0 | 0 |

*Excess noise ratio

TABLE II

COMPUTED SET OF MIXER NOISE PARAMETERS.

| Noise Paramater | | 3σ uncertainty | |
|---|---|---|---|
| $F_{min}^{RF}$ | 3.201 | $\Delta F_{min}^{RF}$ | 0.375 |
| $R_n^{RF}$ (Ω) | 21.262 | $\Delta R_n^{RF}$ (Ω) | 2.608 |
| $|\Gamma_{opt}^{RF}|$ | 0.993 | $\Delta |\Gamma_{opt}^{RF}|$ | 0.0150 |
| $\angle \Gamma_{opt}^{RF}$ (rad) | -0.538 | $\Delta \angle \Gamma_{opt}^{RF}$ (rad) | 0.0341 |
| $F_{min}^{IM}$ | 1.937 | $\Delta F_{min}^{IM}$ | 0.223 |
| $R_n^{IM}$ (Ω) | 1591.3 | $\Delta R_n^{IM}$ (Ω) | 211.52 |
| $|\Gamma_{opt}^{IM}|$ | 0.2662 | $\Delta |\Gamma_{opt}^{IM}|$ | 0.0154 |
| $\angle \Gamma_{opt}^{IM}$ (rad) | -3.064 | $\Delta \angle \Gamma_{opt}^{IM}$ (rad) | 0.0065 |

TABLE III

SIMULATED UNCERTAINTY VALUES.

| Measured parameter | | Uncertainty | Distribution | Reference |
|---|---|---|---|---|
| S-parameter | mean | -55 dB | Rayleigh | [32] |
| (VNA-measurements) | max | -40 dB | | |
| Tuner Repeatability | mean | -50 dB | Rayleigh | [33] |
| | max | -40 dB | | |
| Noise Figure | | 0.05 db | Gaussian | [34] |

Figure 7:
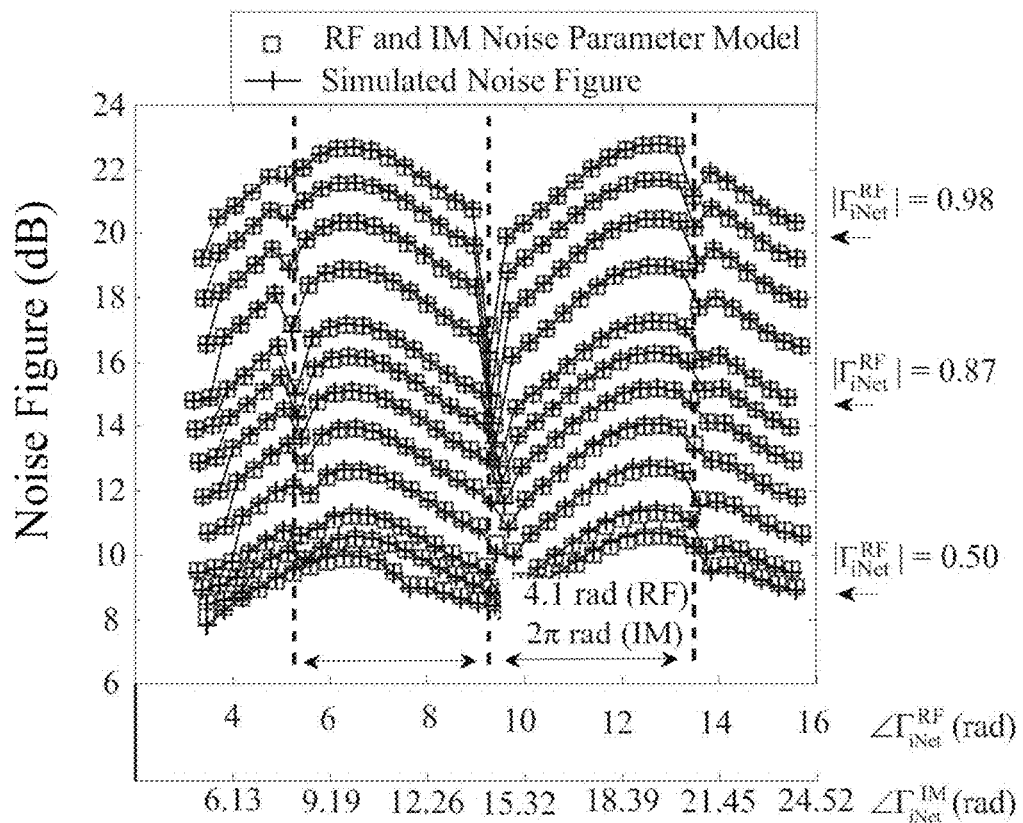
FIG. 7 is a graph of simulated noise results of a Gilbert cell mixer.
Figure 8:
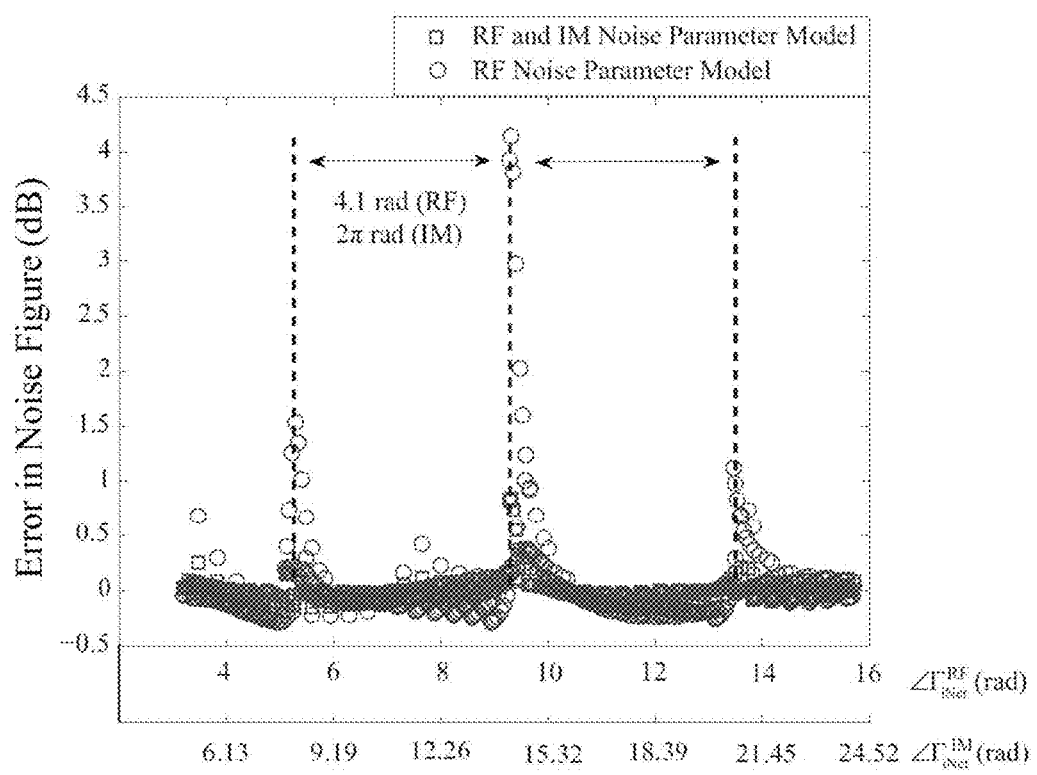
FIG. 8 is a graph of error in simulated noise factor.

The results of modeling the noise factor with RF and IM sets of noise parameters and with the single set of noise parameters are plotted in FIG. 7. The error in noise factor modeling with a single set of noise parameters is compared with the error using the RF and IM sets of noise parameters in FIG. 8. It can be seen that the error using the single noise parameter model increases strongly every 4.1 radians with the maximum error of 4.2 dB, whereas the double noise parameter model performs significantly better achieving a maximum error of 0.9 dB.

The reason for the single noise parameter error increases every 4.1 radians is because the "tuner" used to generate the mixer driving port reflection coefficients behaves differently at RF and IM frequencies. Since $\Gamma_{iNet}^{RF}$ and $\Gamma_{iNet}^{IM}$ are synthesized with transmission lines, their phases are related. Since the RF frequency is 1.9 GHz and the IM frequency is 2.9 GHz, for every $2\pi$ phase change of $\Gamma_{iNet}^{IM}$, $\Gamma_{iNet}^{RF}$ is expected to change by $2\pi$ (1.9/2.9)=4.1 rad. Thus the noise contributions from the IM HSB exhibit more frequent peaks and valleys as $\Gamma_{iNet}^{IM}$ is more sensitive to tuner settings.

A Monte Carlo simulation [9], [30], [31] was also performed to estimate the measurement system sensitivity to measurement uncertainty of our measurement equipment. Table III shows the expected measurement uncertainty for the relevant equipment. This type of uncertainty simulation is used to address what ISO refers to as type-B uncertainty [35]. Type-A uncertainties are associated with power measurements and sufficient averaging make type-A uncertainty negligible compared to type-B [36]. The 3σ uncertainty produced by these settings are included in Table II.

Example 2: Experimental Measurements

Measurements of noise parameters of two commercial Gilbert cell mixers, Analog Devices ADL5801 and Linear Technology LTC5593, are discussed in this example.

A. Experimental Setup

S-parameter measurements were performed with a PNA-5242A VNA and an N4691-60004 calibration kit. All S-parameters were averaged 32 times. The VC-parameters were measured with the same VNA utilizing the frequency offset and vector-mixer/converter (VMC) measurement options 080 and 083. The vector conversion parameter measurement set up included a Reference Mixer (mini Circuits ZX05-153LH+) and a 850-MHZ lowpass filter, a Calibration Mixer (mini Circuits ZX05-153LH+) and a 850-MHZ lowpass filter, a DUT (Linear Technology LTC5593), and DUT (Analog Devices ADL5801). These allowed for vector and scalar calibrated frequency converter measurements [22]-[24]. Option 083 suggests that VMC measurements be performed on devices with high isolation (>20 dB) [23], which is appropriate for most active mixers. The calibration procedure requires a reference mixer and a calibration mixer. The purpose of the reference mixer is to provide a phase reference at port 1, which allow for measurements of phase difference and absolute group delay. The reference mixer measured was a Mini CircuitsZX05-153LH+ passive mixer, and utilized a 850-MHz IF lowpass filter. The calibration mixer is used to move the cross frequency calibration reference plane to the DUT. This calibration mixer is required to be passive and reciprocal such that its up-conversion gain is the same as its down-conversion gain. The calibration mixer was chosen to be the Mini Circuits ZX05-153LH+, and also utilized a 850-MHz IF lowpass filter. The calibration is only setup to perform $VC_{11}$, $VC_{21}$, and $VC_{22}$ measurements. A Maury MT982B01 impedance tuner was used to generate various signal-source impedances at the mixer input. The noise power measurements were performed with an N4000A noise source and a N8975A NFA configured to measure noise over a 4 MHz bandwidth centered around the mixer IF frequency of 650 MHz and to average measurement results 32 times. The VNA was also used to generate a sinusoidal 3.9 GHz LO signal to the two measured mixers.

Two sets of measurements were performed as a cross check:
with upper-side-band (USB) LO
with low-side-band (LSB) LO.

Since for both measurements, the IF frequency was kept the same, the two measurements were equivalent to switching RF and IM side bands. It was expected that both measurements result in the same noise parameters.

TABLE IV

MEASURED VC-PARAMETERS FOR MIXERS WITH USB LO AND LSB LO.

| ADL5801 at RF | | ADL5801 at IM | |
|---|---|---|---|
| $VC_{11}^{RF}$ | 0.3584 − j0.1294 | $VC_{11}^{IM}$ | 0.3737 − j0.0861 |
| $VC_{21}^{RF}$ | −0.3451 − j0.3604 | $VC_{21}^{IM}$ | −0.214 − j0.5528 |
| $VC_{12}^{RF}$ | 0[(1)] | $VC_{12}^{IM}$ | 0[(1)] |
| $VC_{22}^{RF}$ | 0.5194 + j0.2365 | $VC_{22}^{IM}$ | 0.5195 − j0.2365 |

(a) ADL5801 measurement results.

| LTC55933 at RF | | LTC55933 at IM | |
|---|---|---|---|
| $VC_{11}^{RF}$ | 0.1750 − j0.0413 | $VC_{11}^{IM}$ | −0.104 + j0.3589 |
| $VC_{21}^{RF}$ | −1.1745 − j0.4964 | $VC_{21}^{IM}$ | −0.8784 − j0.2995 |
| $VC_{12}^{RF}$ | 0[(1)] | $VC_{12}^{IM}$ | 0[(1)] |
| $VC_{22}^{RF}$ | 0.0235 − j0.3863 | $VC_{22}^{IM}$ | 0.0232 − j0.3860 |

(b) LTC55933 measurement results.

[(1)]$VC_{12} \approx 0$ is required for Agilent VMC measurements and corresponds to >30 dB of RF-to-IF isolation for both mixers.

B. Measurements

Measured VC-parameters for the two mixers are shown in Table IV. Both measured mixers have high RF-to-IF output isolation (>30 dB) according to the data sheets and therefore $VC_{12}^{X}$ are assumed to be 0. High reverse isolation also simplifies the output reflection coefficient of the mixer $\Gamma_{out}$ in (B7) in Appendix B to be just $VC_{22}$ and making it independent of tuner settings.

Figure 9:
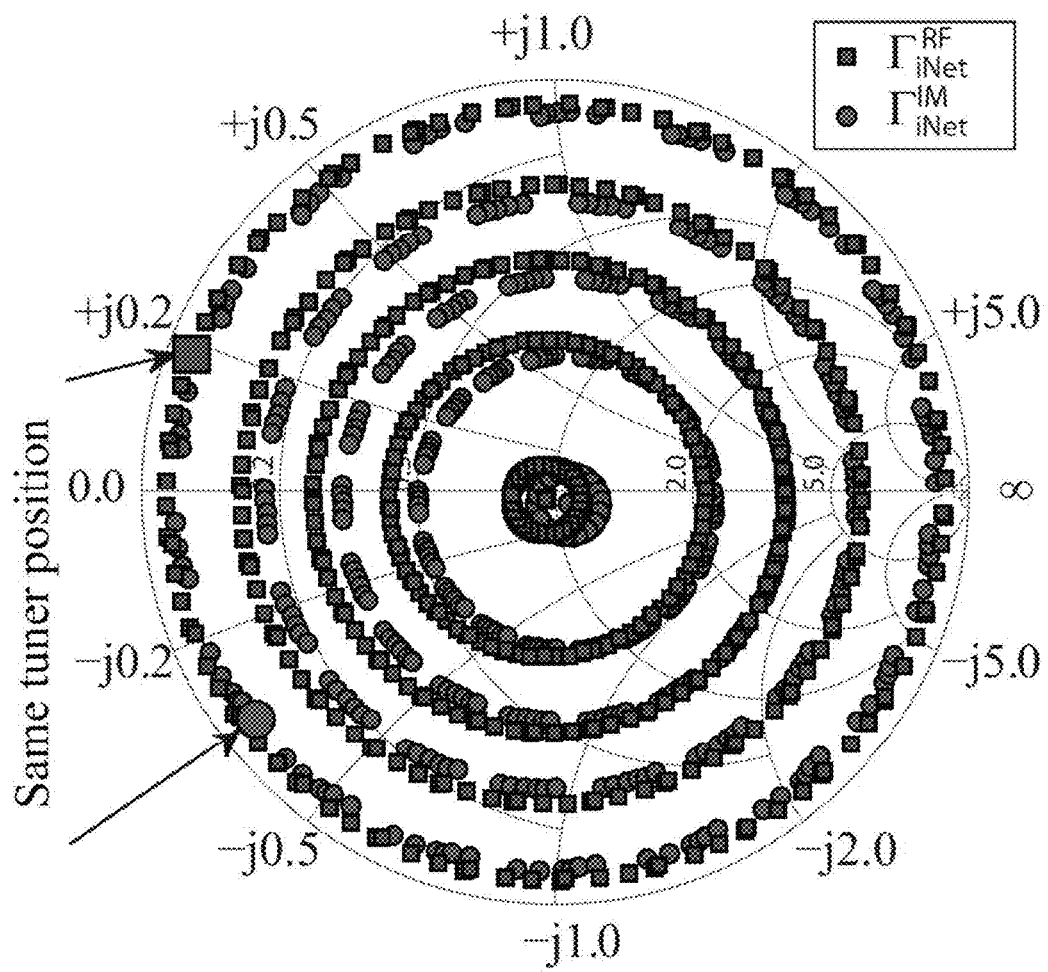
FIG. 9 is an illustration of tuner output reflection coefficients $\Gamma_{iNet(i)}^{RF}$ and $\Gamma_{iNET(i)}^{IM}$.
Figure 10:
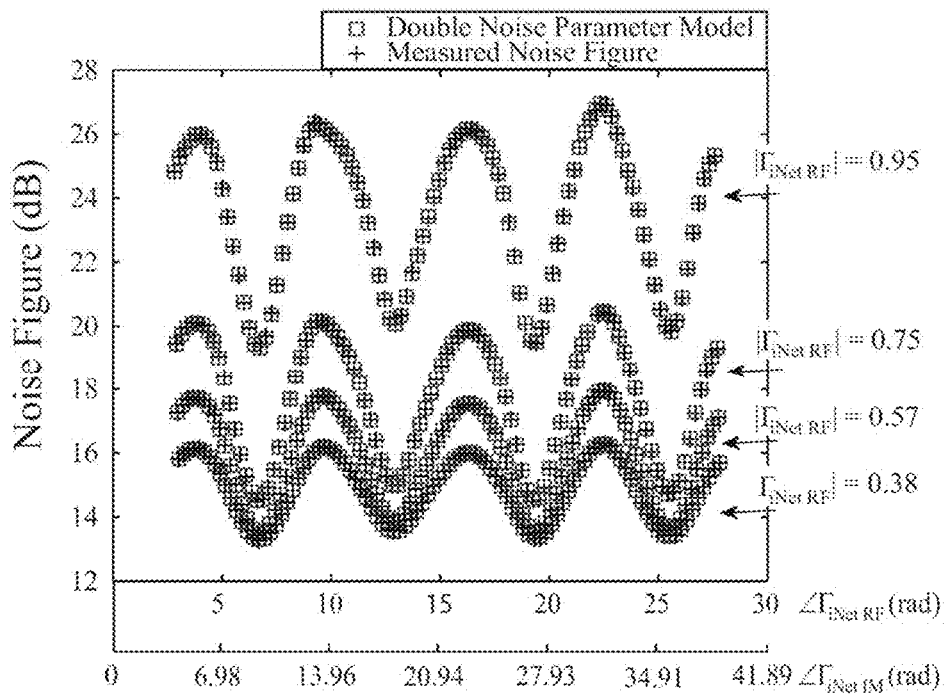
FIG. 10 shows graphs of ADL5801 results (a) RF input referred noise factor and (b) IM input referred noise factor.
Figure 10:
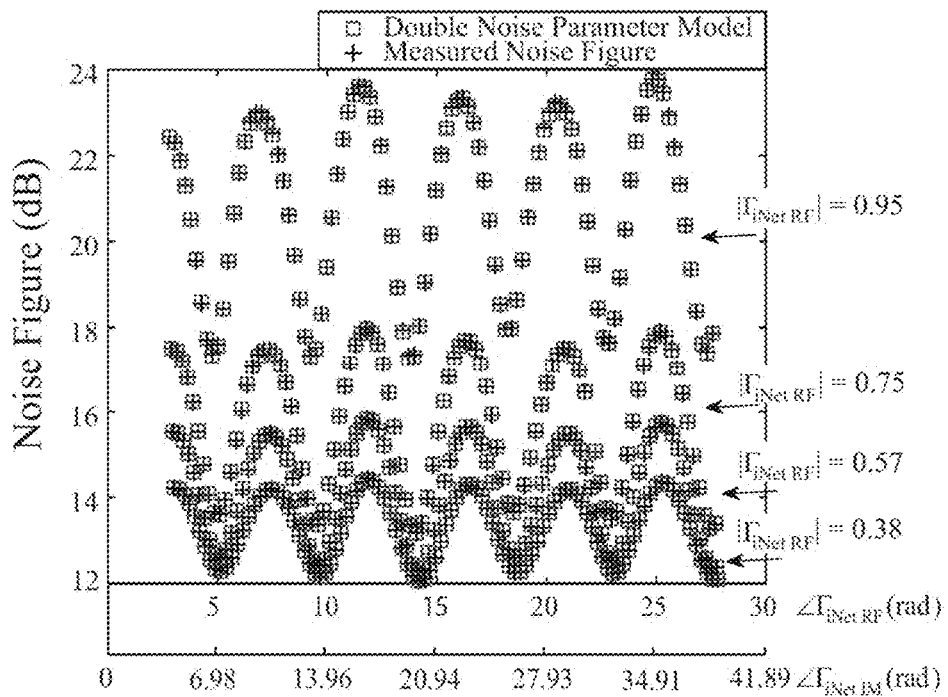
Figure 11:
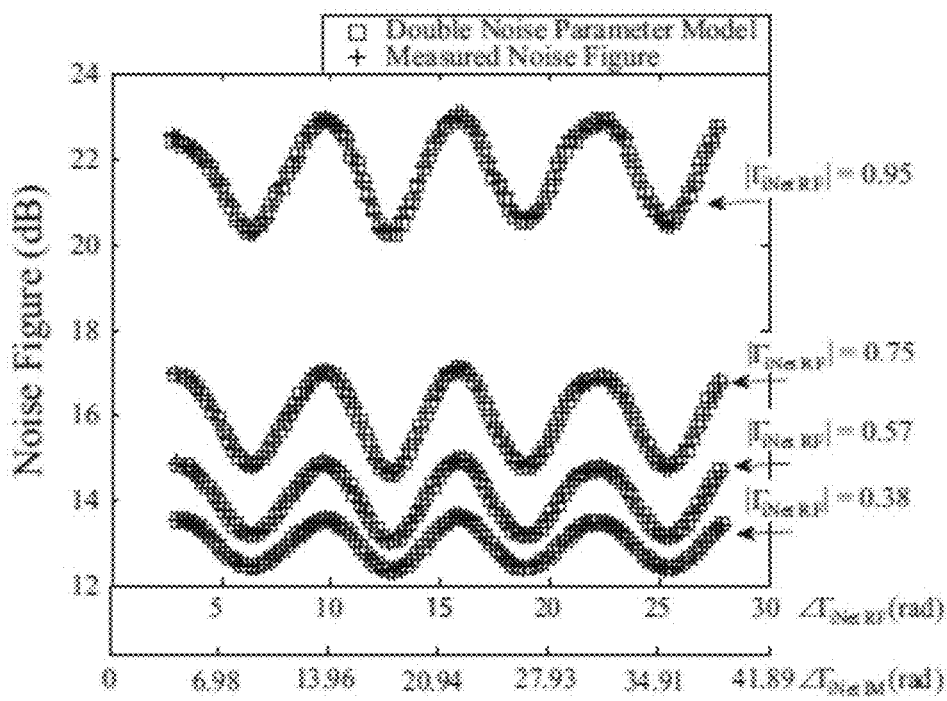
FIG. 11 shows graphs of TLC55933 measurement results (a) RF input referred noise factor and (b) IM input referred noise factor.
Figure 11:
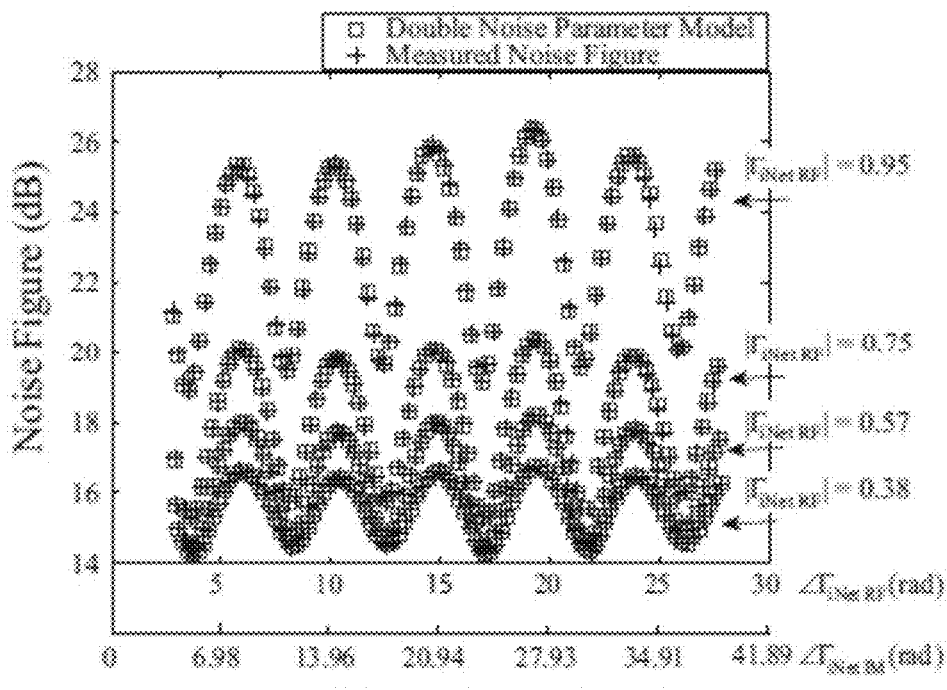

As mentioned above, several signal-source reflection coefficients are needed for each HSB to extract noise parameters. In our setup the tuner was used to generate 606 impedance states, which are shown in FIG. 9 for RF and IM HSBs. As shown in FIG. 9 the phase of the impedance reflection coefficient changes from RF to IM given the same tuner setting. This allows for a large combination of signal source impedances at HSBs. The output noise powers were measured at each of the 606 settings and the associated noise factors extracted as described herein are shown in FIGS. 10 and 11. As with the simulation reported in Example 1, a non-linear least square solution is found using the 606 measured noise powers and the corresponding RF and IM signal source impedances while ignoring other HSBs as their noise contribution was insignificant. Table V shows the least square solutions for both mixers. The USB LO and LSB LO cross-check measurements demonstrate that USB LO and LSB LO noise are very similar as expected. The uncertainty values on the noise parameter solutions shown in Table V were estimated by simulating expected uncertainty using the same Monte Carlo approach as in Example 1.

Figure 12:
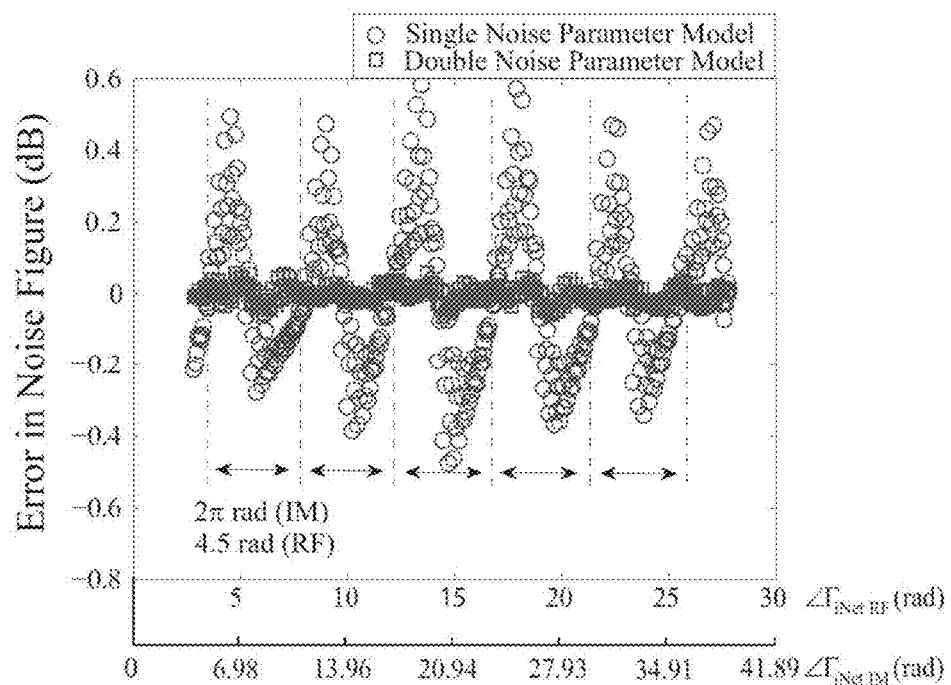
FIG. 12 shows graphs of ADL5801 error between models (a) RF input referred error in modeling noise factor, (b) IM input referred error in modeling noise factor.
Figure 12:
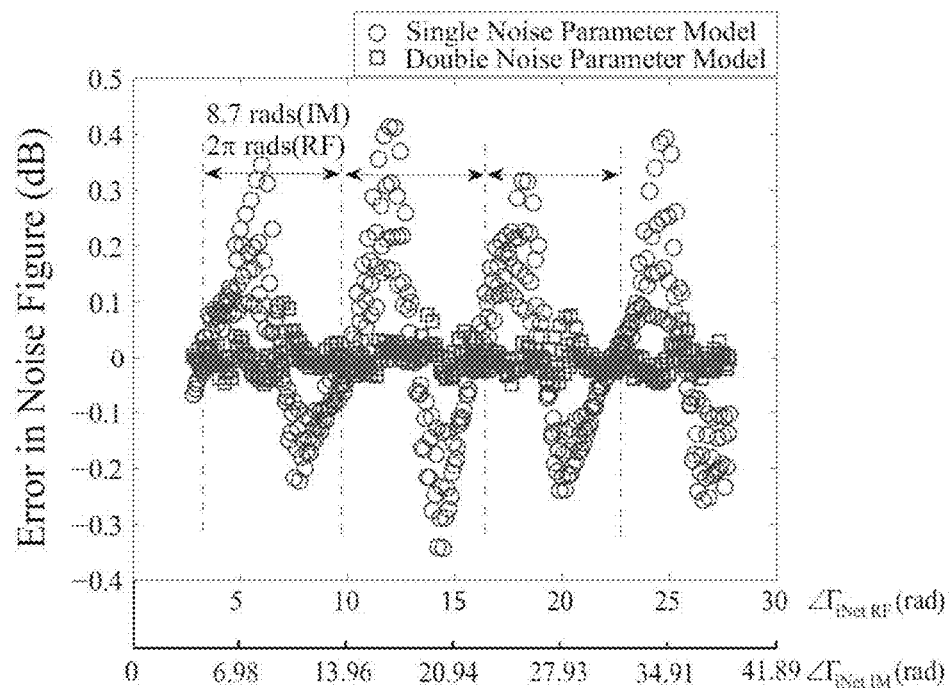
Figure 13:
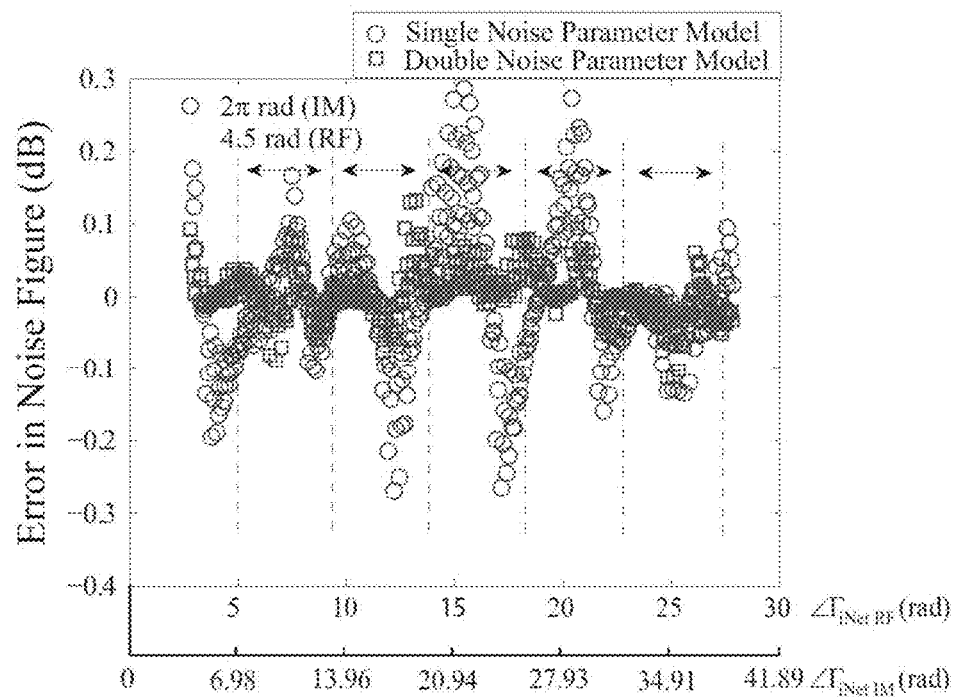
FIG. 13 shows graphs of TLC55933 error between models (a) RF input referred error in modeling noise factor, (b) IM input referred error in modeling noise factor.
Figure 13:
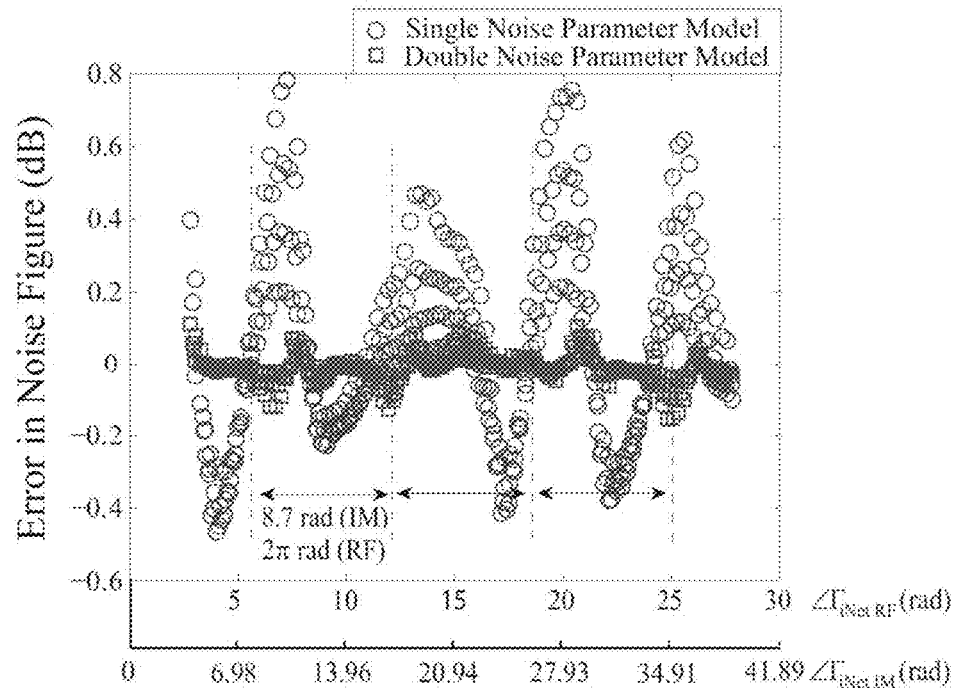

A comparison was performed between the least square solution using a single set of noise parameters and the RF and IM sets of noise parameters. FIGS. 12 and 13 show the error between the two models and the measured noise factor.

The maximum error using the single noise parameter model between these two devices is 0.8 dB while the maximum error using the double noise parameter model is only 0.12 dB. The error using the single noise parameter model also appears cyclical in $\angle\Gamma_{iNet}^{RF}$. As discussed in Example 1, this error term is proportional to the second term in equation (20) and is the reason the error is drastically reduced using the double noise parameter model. The RF frequency was at 3.25 GHz and the IM frequency was at 4.55 GHz, which provides a ratio of 1.4. Therefore the error in the RF input-referred single noise parameter model would be expected to have its error repeated every 4.5 radians with respect to $\angle\Gamma_{iNet}^{RF}$ as shown in FIGS. 12 and 13.

Noise parameters have the advantage of being intuitive as they explicitly define the optimal matching conditions at each HSB of a device to minimize its noise factor. The proposed mixer noise model permits treating a mixer as a "black box" component. This model becomes more relevant when the IF frequency is large and thus the signal-source impedance experiences significant variation from RF to IM. If the IF frequency is low and if the signal-source impedance does not change significantly from RF to IM, then it would be expected that a single set of noise parameters could adequately model the noise in the mixer.

TABLE V

MEASURED NOISE PARAMETERS.

| ADL5801 | USB LO | 3σ[(1)] | LSB LO | 3σ[(1)] |
|---|---|---|---|---|
| $F_{min}^{RF}$ | 6.47 | 1.15 | 6.84 | 1.28 |
| $F_{min}^{IM}$ | 11.26 | 0.64 | 11.55 | 0.67 |
| $R_n^{RF}(\Omega)$ | 168.85 | 9.47 | 177.67 | 9.37 |

TABLE V-continued

| $R_n^{IM}$ ($\Omega$) | 282.0 | 15.06 | 288.8 | 15.50 |
|---|---|---|---|---|
| $|\Gamma_{opt}^{RF}|$ | 0.39 | 0.02 | 0.39 | 0.02 |
| $|\Gamma_{opt}^{IM}|$ | 0.34 | 0.01 | 0.34 | 0.02 |
| $\angle\Gamma_{opt}^{RF}$ (rad) | 0.66 | 0.05 | 0.66 | 0.05 |
| $\angle\Gamma_{opt}^{IM}$ (rad) | 0.38 | 0.03 | 0.38 | 0.03 |

(a) ADL5801 measurement results

| LTC55933 | USB LO | $3\sigma^{(1)}$ | LSB LO | $3\sigma^{(1)}$ |
|---|---|---|---|---|
| $F_{min}^{RF}$ | 13.03 | 0.83 | 13.07 | 0.78 |
| $F_{min}^{IM}$ | 5.61 | 0.85 | 5.53 | 0.90 |
| $R_n^{RF}$ ($\Omega$) | 219.2 | 9.93 | 217.8 | 10.19 |
| $R_n^{IM}$ ($\Omega$) | 109.41 | 13.61 | 110.27 | 13.14 |
| $|\Gamma_{opt}^{RF}|$ | 0.14 | 0.01 | 0.14 | 0.01 |
| $|\Gamma_{opt}^{IM}|$ | 0.43 | 0.04 | 0.43 | 0.04 |
| $\angle\Gamma_{opt}^{RF}$ (rad) | 6.23 | 0.04 | 6.23 | 0.04 |
| $\angle\Gamma_{opt}^{IM}$ (rad) | 4.81 | 0.07 | 4.81 | 0.09 |

(b) LTC55933 measurement results
(1)$3\sigma$ uncertainties were simulated

A difficulty in the proposed measurements has to do with determining the VC-parameters as most existing vector conversion measuring equipment do not support these measurements readily. These measurements are typically limited to measuring forward conversion gain with a single reference mixer installed on the reference interconnect of port 1 on a VNA. For full two-port VC parameters, it would need reference mixers on both port 1 and port 2 as well as a switch to bypass them. To avoid this issue, devices were chosen such that the reverse conversion gain parameter $VC_{12}$ was negligible.

Noise factors of mixers relate to the quality of their LO signals. It is therefore reasonable to assume that mixer noise parameters are also dependent on the LO and they should be remeasured if the LO source is changed.

Example 3: Comparative Example

A mixer measurement procedure was reported in L. D'Addario, "Noise parameters of SIS mixers," IEEE Transactions on Microwave Theory and Techniques, vol. 36, no. 7, pp. 1196-1206, 1988, which is incorporated by reference herein in its entirety for comparison. The procedure herein is compared to this reported procedure. However, the approach in D'Addario, 1988 was not as complete, which does not allow for a direct comparison. In addition, some important information, such as signal-source impedances for the IM sideband that would be needed for a direct comparison, was not reported in the reference. While D'Addario does not solve for all HSB noise parameters independently, the work in this reference serves as a proof of concept for the proposed measurement system, as it demonstrates that a set of noise parameters exists for each HSB.

Analysis of FIGS. 1(c) and (d) from Addario shows the similarities and differences between our measurement procedures. The procedure of the invention is able to treat a mixer as a multi-port device having one port for each HSB. However, for mixers measured in this work it was found that HSBs beyond the IM frequency do not contribute significantly to the mixer noise, and the three-port representation was used in our measurements. The procedure in D'Addario starts with a three-port mixer representation, i.e. RF, IM, and IF ports. The approach then taken terminates the IM port with a fixed admittance $Y_i$. Fixing this admittance effectively reduces the mixer to a two-port model where effective two-port noise parameters are solved for, as shown in D'Addario (FIG. 1(d)). In general these effective two-port noise parameters are dependent on $Y_i$ and are not the same as the RF-port noise parameters found with the method of this invention.

For a few different $Y_i$ D'Addario, FIG. 4(b) shows that the effective measured noise parameter $Y_{opt}$ changes as a function of $Y_i$. Then $Y_i$ is chosen such that the total effective $F_{min}$ is minimized with respect to $Y_i$, thus optimizing the minimum noise figure of the mixer with respect to the IM frequency termination. Since this effective $F_{min}$ is a function of $Y_i$, it is not truly a mixer minimum noise factor. Additionally, as can be seen in D'Addario, FIG. 3(a), the effective $F_{min}$ increases as $Y_i$ approaches the effective $Y_{opt}$ of the RF port and decreases when $Y_i$ is more reflective and far from the effective $Y_{opt}$. D'Addario, FIG. 3(a) rather than $F_{min}$ uses $T_{min} = T_0 (F_{min} - 1)$.

The present work allows for the full characterization of all HSB ports by giving each port its own set of noise parameters ($F_{min}^X$, $Y_{opt}^X$, and $R_n^X$) and making all of them independent of the other HSB terminations. Thus, when considering only RF and IM frequency bands, the present model, having two sets of noise parameters, represents the noise figure of a mixer without the need for converting the mixer from a three-port representation to a two port representation. In addition, the inventive method fully characterizes the mixer noise behavior for any termination at RF and IM ports.

Appendix A: Symbols and Notations
Subscripts/Superscripts/Indices:
X: represents a specific harmonic side band (HSB)
i is an index to a tuner setting
c represents a cold noise source in the calibration stage
h represents a hot noise source in the calibration stage
rec pertains to components or values associated exclusively with the receiver Symbols:
$F^X$: noise factor contribution from HSB X
$F_{Mixer}^{RF,IM}$: mixer noise factor based on RF and IM HSBs only
$P_n^{in}$: input-referred noise power at port X
$P_s^{in}$: input signal available from the signal source
$P_n^{Mixer}$: is the input-referred mixer noise at port X
$SNR_{in}$: input signal-to-noise ratio
$SNR_{out}$: output signal-to-noise ratio
$F_{Mixer}$: single-side-band noise factor of the mixer
$P_{meas}^{DUT}$: measured output noise power for the measurement setup
$P_{IF,cal}$: measured noise power during receiver calibration
M: measurable portion of the receiver transducer gain
$G_{rec}$: internal portion of the receiver transducer gain
$Y_{iNet}^X$: output admittance of the input network at HSB X, $Y_{iNet}^X = G_{iNet}^X + jB_{iNet}^X$
$G_A^X$: available conversion gain
$G_{A,iNet}^X$: available gain of the input network at HSB X
$[S_{iNet}^X]$: S-parameters of the input network
$[VC^X]$: vector-conversion parameters of the mixer
$\Gamma_{out}$: mixer output reflection coefficient
$\Gamma_{iNET}^X$: input network output reflection coefficient
$\Gamma_{rec}$: receiver input reflection coefficient
$F_{min}^X$: minimum noise factor of the DUT at HSB X
$R_n^X$: equivalent noise resistance of the DUT at HSB X Appendix A (Continued)
$Y_{opt}^X$: optimal admittance for minimum noise of the DUT at HSB X
$P_{ns}^{Xc(h)}$: cold and hot noise power of the noise source at HSB X
$F_{min}^{rec}$: minimum noise factor of the receiver $\Gamma_{rec}^{opt}$: optimal reflection coefficient for minimum noise of the receiver $R_n^{rec}$: equivalent noise resistance of the receiver $\Delta f$: noise bandwidth $T_{c(h)}$: cold and hot noise temperatures of the noise source k: Boltzmann's constant $Y_0$: characteristic admittance, $(50\Omega)^{-1}$ $T_0$: reference temperature, 290 K.

Appendix B: Other Expression

The noise power generated by the noise source is $$P_{ns}^{X,c(h)} = k\Delta f T_{c(h)} \tag{B1}$$

To calculate the noise source power it is often assumed that $T_c = T_0$, although using the ambient temperature instead of $T_c$ may be slightly more accurate, and $T_h = ENR \times T_0 + T_c$ [8]. The noise temperature of a passive network, such as a tuner, is found from [7]

$$P_{iNet}^{X,c(h)} = k\Delta f T_0 \left( \frac{1}{G_{A,iNet}^{X,c(h)}} - 1 \right), \tag{B2}$$

where k is Boltzmann's constant, $T_0$ is the reference temperature, $\Delta f$ is the noise bandwidth, and the available gain $G_{A,iNet}^{X,c(h)}$ is found from (8) for a corresponding set of S-parameters. For the input tuner network, it can be rewritten for each HSB as $$G_{A,iNet}^{X,c(h)} = \frac{1 - |\Gamma_{ns}^{c(h)}|^2}{|1 - \Gamma_{ns}^{c(h)} S_{11}^{X,iNet}|^2} \frac{|S_{21}^{X,iNet}|^2}{1 - |\Gamma_{iNet}^{X,c(h)}|^2}. \tag{B3}$$

The output reflection coefficient of the two-port input network is [21]

$$\Gamma_{iNet}^{X,c(h)} = S_{22}^{X,iNet} + \frac{S_{21}^{X,iNet} S_{12}^{X,iNet} \Gamma_{ns}^{c(h)}}{1 - S_{11}^{X,iNet} \Gamma_{ns}^{c(h)}}. \tag{B4}$$

With (B1)-(B3), the noise power at the mixer input is expressed as $$P_{in}^{X,c(h)} = (P_{ns}^{X,c(h)} + P_{sNet}^{X,c(h)}) G_{A,tNet}^{X,c(h)}. \tag{B5}$$

Appendix B (Continued)

The receiver transducer gain is [7]

$$G_T^{rec} = \underbrace{\frac{1 - |\Gamma_{iNet(i)}^{IF,c(h)}|^2}{|1 - \Gamma_{iNet(i)}^{IF,c(h)} \Gamma_{rec}|^2}}_{M_{(i)}^{c(h)}} \times \underbrace{\frac{|S_{21}^{rec}|^2 (1 - |\Gamma_L^{rec}|^2)}{|1 - \Gamma_L^{rec} S_{22}^{rec}|^2}}_{G_{rec}}, \tag{B6}$$

where the portion, which is identified as $G_{rec}$, is due to internal parameters ($S_{22}^{rec}$, $S_{21}^{rec}$ and $\Gamma_L^{rec}$) of the receiver that are not measurable on their own and is $M_{(i)}^{c(h)}$ the measurable portion of the transducer gain.

The output reflection coefficient of a mixer is found as $$\Gamma_{out(i)} = VC_{22}^X + \sum_{X=RF}^{HSBmax} \frac{VC_{21}^X VC_{12}^X \Gamma_{iNet}^{X,c}}{1 - VC_{11}^X \Gamma_{iNet}^{X,c}}. \tag{B7}$$

REFERENCES

[1] R. Lane, "The determination of device noise parameters," Proceedings of the IEEE, vol. 57, no. 8, pp. 1461-1462, 1969.

[2] M. Mitama and H. Katoh, "An Improved Computational Method for Noise Parameter Measurement," IEEE Transactions on Microwave Theory and Techniques, vol. 27, pp. 612-615, June 1979.

[3] M. Sannino, "On the determination of device noise and gain parameters," Proceedings of the IEEE, vol. 67, pp. 1364-1366, September 1979.

[4] G. Vasilescu, G. Alquie, and M. Krim, "Exact computation of two-port noise parameters," Electronics letters, vol. 25, pp. 292-293, February 1989.

[5] A. Davidson, B. Leake, and E. Strid, "Accuracy improvements in microwave noise parameter measurements," IEEE Transactions on Microwave Theory and Techniques, vol. 37, pp. 1973-1978, December 1989.

[6] D. Pasquet, E. Bourdel, S. Quintanel, T. Ravalet, and P. Houssin, "New Method for Noise-Parameter Measurement of a Mismatched Linear Two-Port Using Noise Power Wave Formalism," IEEE Transactions on Microwave Theory and Techniques, vol. 56, pp. 2136-2142, September 2008.

[7] L. Belostotski and J. Haslett, "Evaluation of Tuner-Based Noise-Parameter Extraction Methods for Very Low Noise Amplifiers," IEEE Transactions on Microwave Theory and Techniques, vol. 58, no. 1, pp. 236-250, 2010.

[8] L. Belostotski, "A Calibration Method for RF and Microwave Noise Sources," IEEE Transactions on Microwave Theory and Techniques, vol. 59, no. 1, pp. 178-187, 2011.

[9] J. Randa, Amplifier and transistor noise-parameter measurements. Wiley Encyclopedia of Electrical and Electronics Engineering, John Wiley & Sons, Inc., 2014.

[10] M. Himmelfarb and L. Belostotski, "On impedance-pattern selection for noise parameter measurement," IEEE Transactions on Microwave Theory and Techniques, vol. 64, pp. 258-270, January 2016.

[11] H. Darabi and A. Abidi, "Noise in RF-CMOS mixers: a simple physical model," IEEE Journal of Solid-State Circuits, vol. 35, pp. 15-25, January 2000.

[12] D. Held and A. Kerr, "Conversion Loss and Noise of Microwave and Millimeterwave Mixers: Part 1—Theory," IEEE Transactions on Microwave Theory and Techniques, vol. 26, pp. 49-55, February 1978.

[13] V. Rizzoli, F. Mastri, and C. Cecchetti, "Computer-aided noise analysis of MESFET and HEMT mixers," IEEE Transactions on Microwave Theory and Techniques, vol. 37, no. 9, pp. 1401-1410, 1989.

[14] U. L. Rohde, C.-R. Chang, J. Gerber, and R. Pengelly, "Parameter extraction for large signal noise models and simulation of noise in large signal circuits like mixers and oscillators," in European Microwave Conference, pp. 465-470, 1993.

[15] A. Cappy, F. Danneville, G. Dambrine, and B. Tamen, "Noise analysis in devices under nonlinear operation," Solid-State Electronics, vol. 43, no. 1, pp. 21-26, 1999.

[16] L. D'Addario, "Noise parameters of SIS mixers," IEEE Transactions on Microwave Theory and Techniques, vol. 36, no. 7, pp. 1196-1206, 1988.

[17] H. Hillbrand and P. Russer, "An efficient method for computer aided noise analysis of linear amplifier networks," IEEE Transactions on Circuits and Systems, vol. 23, no. 4, pp. 235-238, 1976.

[18] M. Terrovitis and R. Meyer, "Noise in current-commutating CMOS mixers," IEEE Journal of Solid-State Circuits, vol. 34, pp. 772-783, June 1999.
[19] H. T. Friis, "Noise Figures of Radio Receivers," Proceedings of the IRE, vol. 32, pp. 419-422, July 1944.
[20] P. Heydari, "High-frequency noise in RF active CMOS mixers," in Asia and South Pacific Design Automation Conference, (Yokohama, Japan), pp. 57-61, 2730 January 2004.
[21] G. Gonzalez, Microwave Transistor Amplifiers: Analysis and Design. Toronto: Prentice Hall, 1997.
[22] J. Dunsmore, "Novel method for vector mixer characterization and mixer test system vector error correction," in 2002 IEEE MTT-S International Microwave Symposium Digest, vol. 3, pp. 1833-1836 vol. 3, June 2002.
[23] Agilent, "Improving Measurement and Calibration Accuracy using the Frequency Converter Application-Application Note 1408-3," White Paper, 2006.
[24] Agilent, "Accurate Mixer Measurements Using the Frequency-Offset Mode Application Note 1463-6," White Paper, 2007.
[25] K. Levenberg, "A Method for the Solution of Certain Problems in Least-Squares," Quarterly Applied Mathematics 2, pp. 164-168, 1944.
[26] D. Marquardt, "An Algorithm for Least-squares Estimation of Nonlinear Parameters," SIAM Journal Applied Mathematics, vol. 11, pp. 431-441.
[27] M. Pospieszalski, "Modeling of noise parameters of MESFETs and MODFETs and their frequency and temperature dependence," IEEE Transactions on Microwave Theory and Techniques, vol. 37, pp. 1340-1350, September 1989.
[28] L. Boglione, "An Original Demonstration of the formula $T_{min}=T_0$ 4N inequality for Noisy Two-Port Networks," IEEE Microwave and Wireless Components Letters, vol. 18, pp. 326-328, May 2008.
[29] L. Belostotski, "On the Number of Noise Parameters for Analyses of Circuits With MOSFETs," vol. 59, pp. 877-881, April 2011.
[30] J. Randa, "Noise-Parameter Uncertainties: A Monte Carlo Simulation," Journal of Research of the National Institute of Standards and Technology, 2002.
[31] J. Randa, "Uncertainties in NIST Noise-Temperature Measurements," Tech. Rep. 1502, National Institute of Standards and Technology, March 1998.
[32] Agilent Technologies Inc., "Agilent 2-Port and 4-Port PNA-X Network Analyzer N5249A-10 MHz to 8.5 GHz N5241A-10 MHz to 13.5 GHz N5242A-10 MHz to 26.5 GHz Data Sheet and Technical Specifications," April 2014.
[33] Maury Microwave Corp., "Tuner Repeatability: Fact and Fiction," June 1999.
[34] Agilent Technologies Inc., "Agilent N8973A, N8974A, N8975A NFA Series Noise Figure Analyzers," November 2007.
[35] ISO Guide to the Expression of Uncertainty in Measurement. Geneva, Switzerland: International Organization for Standardization, 1993.
[36] J. Randa and D. Walker, "On-Wafer Measurement of Transistor Noise Parameters at NIST," vol. 56, pp. 551-554, April 2007.

We claim:

1. A method of measuring noise parameters of a frequency conversion device in a test setup including a tuner and a receiver, comprising:
   a. setting a tuner state to one of a set of tuner states;
   b. setting a sweep parameter to a value in a set of multiple sweep parameter values;
   c. measuring noise power of the receiver at said tuner state and sweep parameter value without the frequency conversion device in the test setup;
   d. repeating steps (b) and (c) for a different sweep parameter value in said set of multiple sweep parameter values until noise power of the receiver has been measured for all sweep parameter values in said set and extract the receiver noise parameters;
   e. setting a sweep parameter to a value in a second set of multiple sweep parameter values;
   f. measuring noise power at an output of the frequency conversion device at said tuner state and sweep parameter value with the frequency conversion device in the test setup;
   g. repeating steps (e) and (f) until noise power has been measured for each of said tuner states in said set of tuner states, and wherein the noise power of the frequency conversion device is measured as a function of the sweep parameter for said set of parameter values for one tuner state at a time.

2. The method of claim 1, wherein the frequency conversion device is a non-linear device.

3. The method of claim 1, wherein said sweep parameter is admittance.

4. The method of claim 1, wherein said sweep parameter is reflection coefficient.

5. The method of claim 1, wherein said sweep parameter is impedance.

6. The method of claim 1, wherein the tuner is a mechanical tuner, and each tuner state in said set of tuner states corresponds to one mechanical setting of said mechanical tuner.

7. The method of claim 1, further comprising:
   determining the scattering parameters of the input tuner.

8. The method of claim 7, wherein the frequency conversion device has at least two harmonic side bands, the method comprising the steps of:
   a1. sweeping through a predetermined range of tuner admittances in the test setup and determining the output noise power at the receiver with each admittance and extracting the receiver noise parameters;
   b1. determining the vector conversion parameters of the frequency conversion device for each harmonic side band outside of the test setup;
   c1. sweeping through a predetermined range of tuner admittances, measuring the noise power at the output of the frequency conversion device in the test setup with the receiver to determine the noise parameters of the frequency conversion device.

9. The method of claim 8, wherein the frequency conversion device is a non-linear device.

10. The method of claim 1, further comprising: determining the vector conversion parameters of the frequency conversion device under test.

11. The method of claim 1, wherein said tuner is a solid state tuner, using a plurality of solid state control elements.

12. The method of claim 1, wherein the test setup includes a noise analyzer, and the noise power of the receiver and the frequency device are collected for calibrating or extracting noise parameters of the noise analyzer.

13. The method of claim 1, wherein the noise power of the receiver and frequency conversion device are used to determine noise parameters of the frequency conversion device at a harmonic side band.

14. The method of claim 1, wherein said noise power measurements are sufficient to determine a set of noise parameters of the receiver, including: gain of the receiver and the noise figure minimum of the receiver.

15. The method of claim 14, further comprising measuring output noise in the band just next to the band where an amplified LO signal appears at the IF port.

16. The method of claim 1, wherein the frequency conversion device has local oscillator (LO), radio frequency (RF) and intermediate frequency (IF) at the same frequencies.

17. The method of claim 16, further comprising measuring output noise with an averaging power meter at which output the amplified LO signal appearing at the IF port averages out.

18. The method of claim 16, further comprising using a coupler to reduce the strengths of the LO signal appearing at the IF port.

19. The method of claim 16, further comprising using a filter to reduce the LO signal appearing at the IF port.

20. An automated test setup, wherein the method of claim 1 is implemented by computer software algorithms installed on the test setup.

* * * * *

UNITED STATES PATENT AND TRADEMARK OFFICE
CERTIFICATE OF CORRECTION

PATENT NO. : 9,929,757 B2
APPLICATION NO. : 15/493811
DATED : March 27, 2018
INVENTOR(S) : Leo Belostotski et al.

It is certified that error appears in the above-identified patent and that said Letters Patent is hereby corrected as shown below:

In the Claims

At Column 24, Line 55, Claim 10, delete "under test".

Signed and Sealed this
Seventh Day of May, 2019

Andrei Iancu
*Director of the United States Patent and Trademark Office*